(12) United States Patent
Zarra

(10) Patent No.: US 11,490,527 B2
(45) Date of Patent: Nov. 1, 2022

(54) METHOD FOR PROVIDING ELECTRICAL CONNECTIONS AND APPARATUS COMPRISING ELECTRICAL CONNECTIONS

(71) Applicant: Nokia Technologies Oy, Espoo (FI)

(72) Inventor: Salvatore Zarra, Princeton, NJ (US)

(73) Assignee: Nokia Technologies Oy, Espoo (FI)

( * ) Notice: Subject to any disclaimer, the term of this patent is extended or adjusted under 35 U.S.C. 154(b) by 4 days.

(21) Appl. No.: 17/262,055

(22) PCT Filed: Jul. 23, 2019

(86) PCT No.: PCT/FI2019/050557
§ 371 (c)(1),
(2) Date: Jan. 21, 2021

(87) PCT Pub. No.: WO2020/025855
PCT Pub. Date: Feb. 6, 2020

(65) Prior Publication Data
US 2021/0329792 A1    Oct. 21, 2021

(30) Foreign Application Priority Data
Jul. 31, 2018    (EP) ..................... 18186695

(51) Int. Cl.
H05K 1/18    (2006.01)
H05K 3/36    (2006.01)
H05K 1/02    (2006.01)
H05K 1/14    (2006.01)
H05K 3/12    (2006.01)

(52) U.S. Cl.
CPC ............. *H05K 3/361* (2013.01); *H05K 1/028* (2013.01); *H05K 1/14* (2013.01); *H05K 3/12* (2013.01)

(58) Field of Classification Search
CPC .......... H05K 3/361; H05K 1/028; H05K 1/14; H05K 3/12
USPC .......................................... 361/749
See application file for complete search history.

(56) References Cited

U.S. PATENT DOCUMENTS

| 2014/0340857 | A1  | 11/2014 | Hsu et al. ..................... 361/749 |
| 2015/0305643 | A1* | 10/2015 | Negi .................... A61B 5/6846 29/854 |
| 2016/0358849 | A1* | 12/2016 | Jur .......................... H01L 27/16 |
| 2017/0005077 | A1  | 1/2017  | Kim et al. |
| 2017/0181276 | A1  | 6/2017  | Sawada et al. |

(Continued)

*Primary Examiner* — Binh B Tran
(74) *Attorney, Agent, or Firm* — Harrington & Smith

(57) ABSTRACT

This application relates to a method and apparatus formed using the method. The method includes using a first process to form at least one conductive trace on a flexible surface and using a second process to form at least one bead of fluid conductive material at a first location. The method also includes positioning at least one printed circuit board overlaying conductive trace such that the at least one bead of fluid conductive material is aligned with at least one hole in the printed circuit board and pushing the printed circuit board towards the flexible surface. The pushing of the printed circuit board toward the flexible surface forces the bead of fluid conductive material through the hole to form an electrical connection between the at least one conductive trace and an upper surface of the printed circuit board.

20 Claims, 16 Drawing Sheets

(56) References Cited

U.S. PATENT DOCUMENTS

Figure 1:
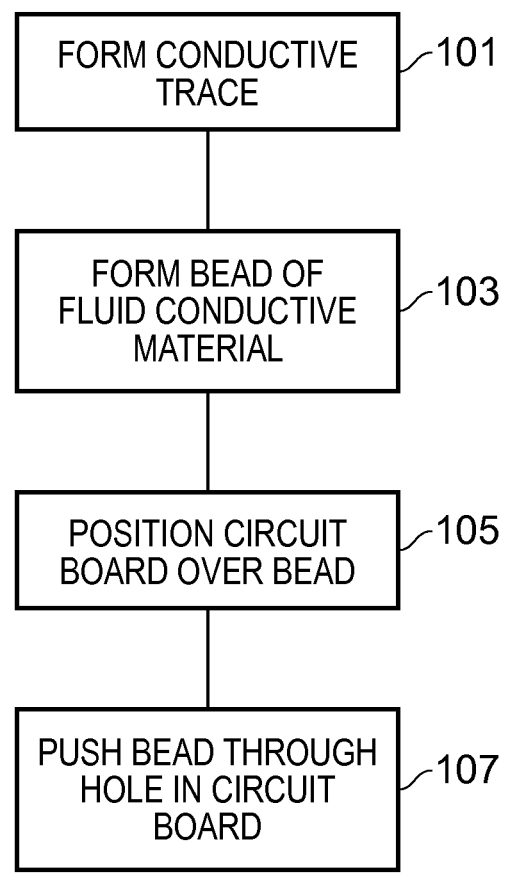

2020/0337641 A1* 10/2020 Wang .................... A61B 5/1486
2021/0076504 A1* 3/2021 Deppe .................... H05K 1/189

* cited by examiner

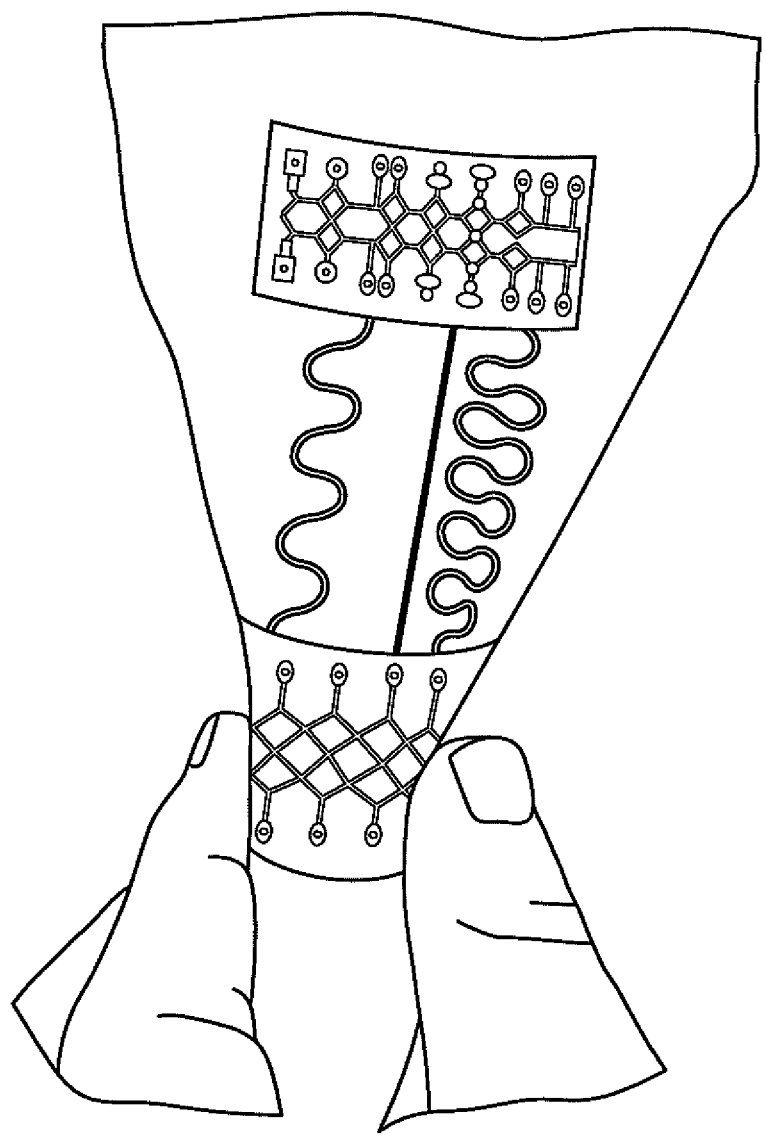

METHOD FOR PROVIDING ELECTRICAL CONNECTIONS AND APPARATUS COMPRISING ELECTRICAL CONNECTIONS

CROSS REFERENCE TO RELATED APPLICATION

This patent application is a U.S. National Stage application of International Patent Application Number PCT/FI2019/050557 filed Jul. 23, 2019, which is hereby incorporated by reference in its entirety, and claims priority to EP 18186695.5 filed Jul. 31, 2018.

TECHNOLOGICAL FIELD

Examples of the present disclosure relate to a method for providing electrical connections and apparatus comprising electrical connections. Some relate to a method for providing electrical connections between flexible substrates and circuit boards and apparatus comprising such connections.

BACKGROUND

Electronic devices can comprise stretchable or flexible parts. For example a wearable electronic device may comprise fabric portions which could have electrical connections provided on them. These devices need reliable electrical connections.

BRIEF SUMMARY

According to various, but not necessarily all, examples of the disclosure there is provided a method comprising: using a first process to form at least one conductive trace on a flexible surface; using a second process to form at least one bead of fluid conductive material at a first location; positioning at least one printed circuit board overlaying at least part of the at least one conductive trace such that the at least one bead of fluid conductive material is aligned with at least one hole in the printed circuit board; and pushing the printed circuit board towards the flexible surface so as to force the bead of fluid conductive material through the hole to form an electrical connection between the at least one conductive trace and an upper surface of the printed circuit board.

The first process may comprise a process which enables conductive material to be deposited across the flexible surface.

The first process may comprise at least one of screen printing, gravure, roll-to-roll, flexographic printing, 3D printing, spray coating, ink dispensing.

The second process may comprise a process which enables the bead of fluid conductive material to be deposited at a selected location.

The second process may comprise at least one of depositing, dispensing, stencil printing.

The bead of fluid conductive material may comprise the same material as the at least one conductive trace.

The at least one conductive trace may comprise a flexible conductive trace.

The method may comprise providing adhesive on an underside of the at least one printed circuit board.

The method may comprise curing the fluid conductive material to provide a fastening between the at least one printed circuit board and the flexible material.

The flexible surface may form part of an item of clothing.

According to various, but not necessarily all, examples of the disclosure there is provided an apparatus comprising: at least one conductive trace provided on a flexible surface; at least one printed circuit board positioned overlaying at least part of the at least one conductive trace; at least one connection between the at least one conductive trace and an upper surface of the at least one printed circuit board wherein the at least one connection extends through a hole in the at least one printed circuit board; and wherein the at least one connection was formed by pushing a bead of fluid conductive material from the conductive trace through the hole.

The at least one conductive trace and the at least one connection may be formed from the same material.

The at least one conductive trace may be formed using a first process and the at least one connection may be formed using a second, different process.

The at least one conductive trace may comprise a flexible conductive trace.

The apparatus may comprise an adhesive on an underside of the at least one printed circuit board.

BRIEF DESCRIPTION

Figure 2:
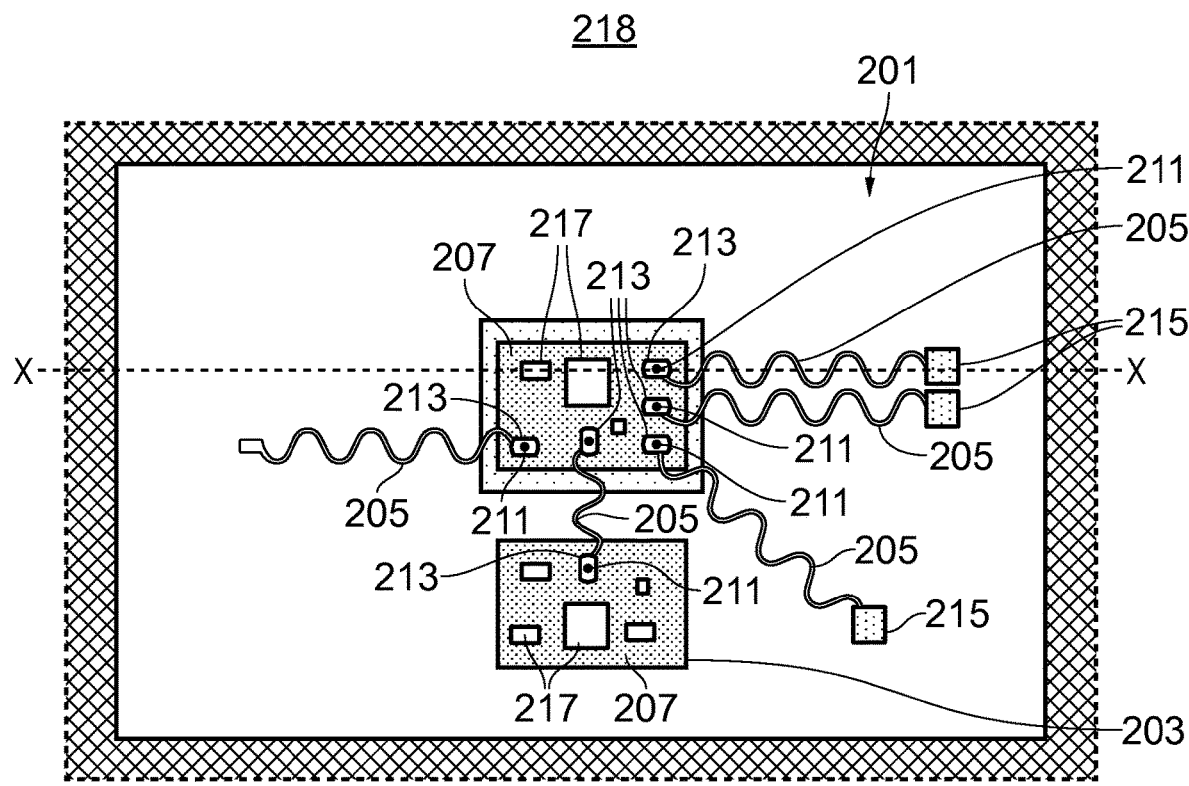
Figure 3:
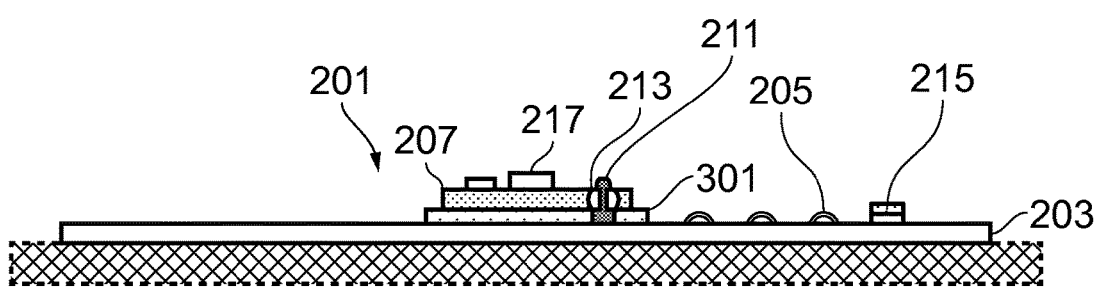
Figure 4:
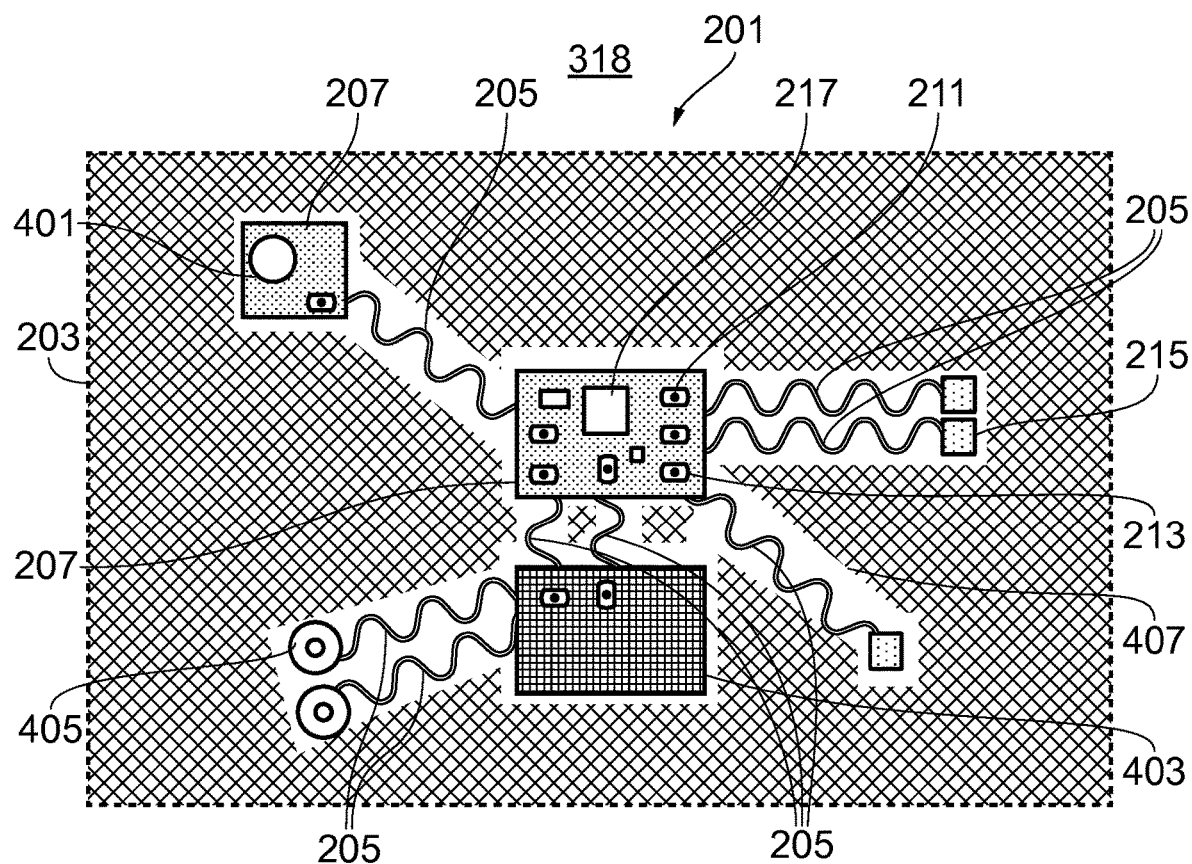
Figure 8A:
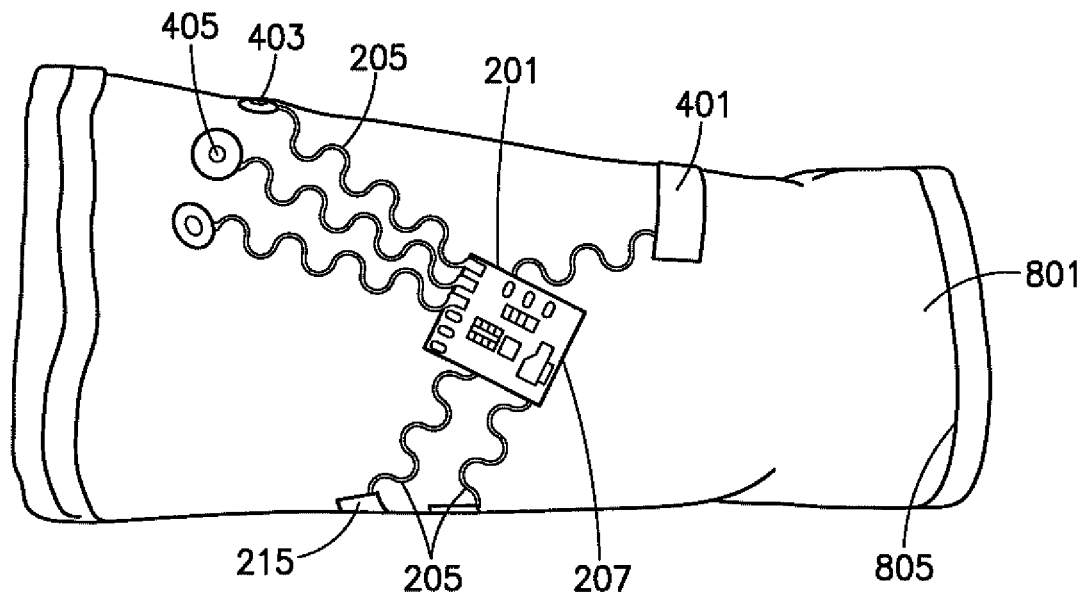
Figure 8B:
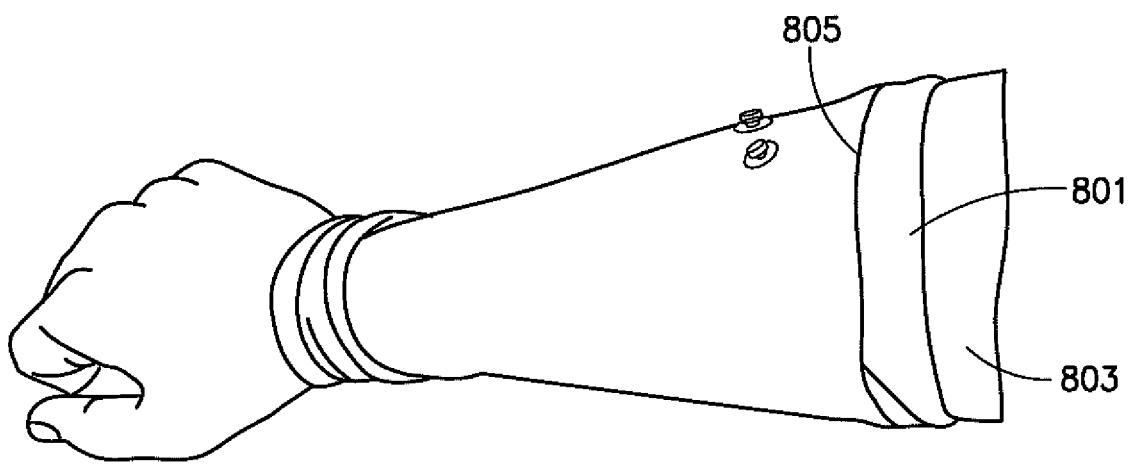
Figure 9:
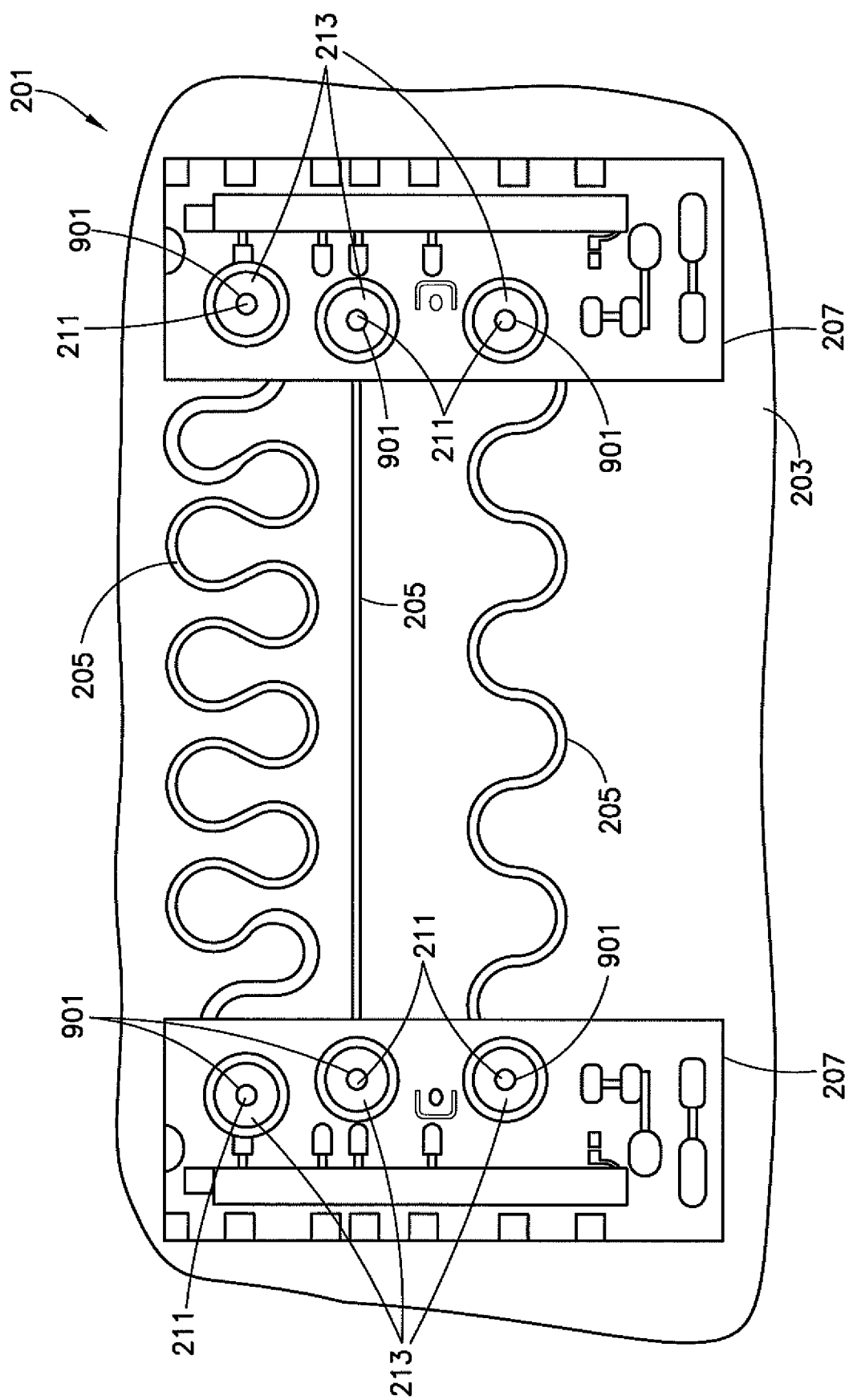
Figure 10A:
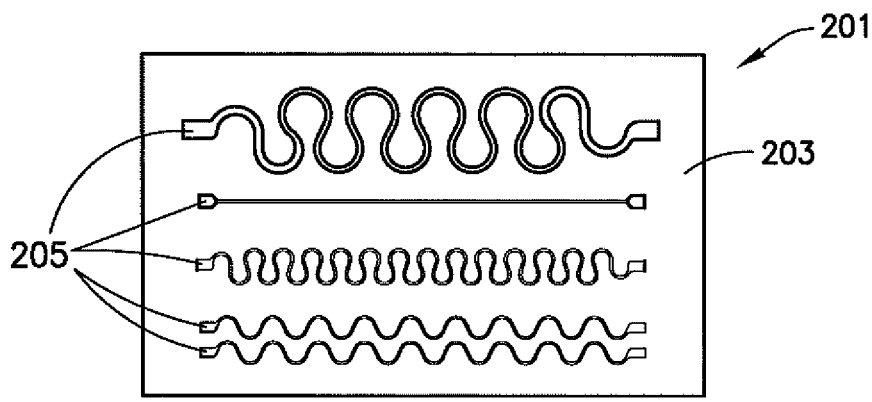
Figure 10B:
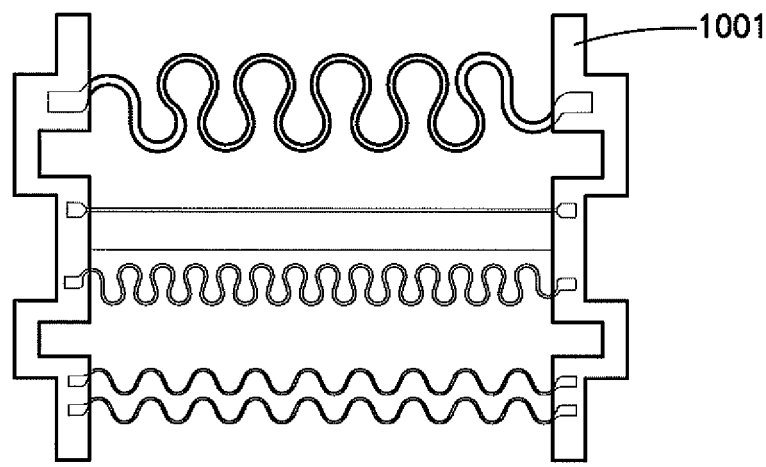
Figure 10C:
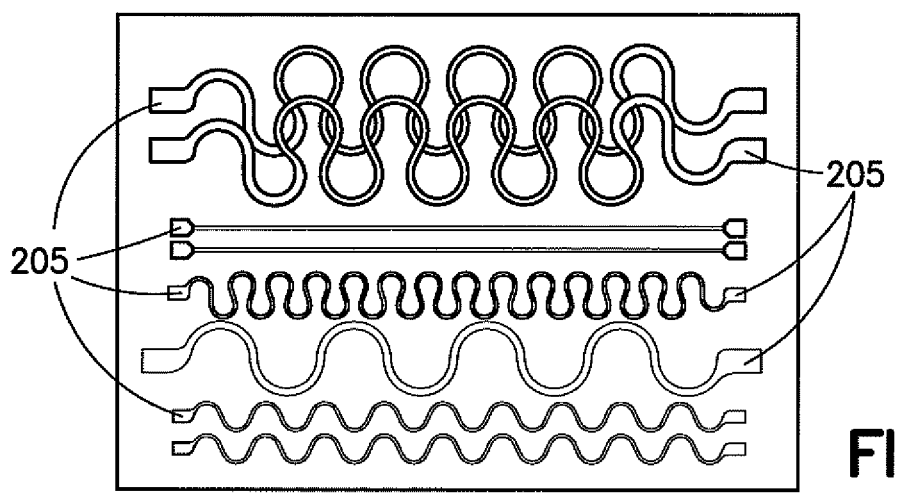

Some example embodiments will now be described with reference to the accompanying drawings in which:

FIG. 1 illustrates an example method;
FIG. 2 is a plan view of an example apparatus;
FIG. 3 is a cross section of an example apparatus;
FIG. 4 is a plan view of an example apparatus;
FIGS. 5A to 5D show example snap connectors that may be used with the apparatus;
FIGS. 6A to 6G show an example method;
FIGS. 7A to 7F show an example method;
FIGS. 8A and 8B show a wearable electronic device;
FIG. 9 shows an example apparatus;
FIGS. 10A to 10C show an example method; and
FIGS. 11A to 11D show components of an example apparatus.
FIG. 12 is a plan view of an example apparatus.

DETAILED DESCRIPTION

The Figures illustrate a method comprising using 101 a first process to form at least one conductive trace 205 on a flexible surface 203 and using 103 a second process to form at least one bead of fluid conductive material at a first location on the at least one conductive trace 205. The first process may be different to the second process. The method also comprises positioning 105 at least one printed circuit board 207 overlaying the at least one bead of fluid conductive material such that the at least one bead of fluid conductive material is aligned with at least one hole 213 in the printed circuit board 207 and pushing 107 the printed circuit board 207 towards the flexible surface 203 so as to force the bead of fluid conductive material through the hole 213. This forms an electrical connection 211 between the at least one conductive trace 205 and an upper surface of the printed circuit board 207.

This provides the technical effect of providing an electrical connection which provides dual functionality as a fastener to help fasten the printed circuit board 207 to the flexible surface 203. The apparatus 201 that are formed by these methods may be for use in wearable electronic devices.

FIG. 1 illustrates a method according to examples of the disclosure. The method may be used to form connectors in devices such as wearable electronic devices or other devices that comprise an electrical connection between a flexible surface 203 and a printed circuit board 207.

The method comprises, at block 101 using a first process to form at least one conductive trace 205 on a flexible surface 203.

The flexible surface 203 may be configured to change shape in response to a physical force applied by a user of the apparatus 201. The change in shape may comprise bending, folding, twisting, stretching, compression, shearing or any other suitable deformation of the flexible surface 203. The change in shape could enable the flexible surface 203 to be attached to a subject. For instance a flexible strap or cuff could be wrapped around a person's arm or torso or other part of their body.

The flexible surface 203 could comprise any suitable material. The flexible surface 203 comprises a non-conductive material. In some examples the flexible surface could comprise fabric, paper, polymeric material, elastomeric material or any other suitable type of material.

In some examples the flexible surface 203 could form part of an item of clothing. For example the flexible surface 203 could be the fabric of a shirt or other wearable item. In some examples the flexible surface 203 could comprise part of a sleeve, cuff, strap or other article that can be attached to the subject's body.

In some examples the flexible surface 203 could comprise a flexible substrate which can be transferred to an item of clothing. For instance, the flexible surface 203 could be a carrier substrate such as a sheet of PET (Polyethylene terephthalate) or any other suitable material. In such examples the carrier substrate could be transferred to the item of clothing after the electrical connections 211 have been formed.

The conductive traces 205 may comprise means for providing a path for direct current between different electronic components within an apparatus 201. The conductive traces 205 may comprise traces of any suitable conductive material. The conductive traces 205 could comprise copper, silver, indium tin oxide or any other suitable material.

The conductive traces 205 may comprise flexible conductive traces. The conductive traces 205 may comprise flexible portions which can be deformed when a force is applied to the conductive trace 205 by a user. For example if the user bends or stretches the flexible surface 203 the conductive trace 205 could also bend or stretch with the flexible surface 203.

The first process that is used to form the one or more conductive traces 205 comprises a process which enables conductive material to be deposited across the flexible surface 203. The first process may enable conductive material to be deposited across different areas of the flexible surface 203 at the same time. The first method may enable fast and/or uniform coverage of the selected areas of the flexible surface 203. In some examples the first process comprises at least one of screen printing, gravure, roll-to-roll, flexographic printing, 3D printing, spray coating and ink dispensing.

The method comprises, at block 103, using a second process to form at least one bead of fluid conductive material at a first location on the at the at least one conductive trace 205. In some examples a plurality of beads of fluid conductive material may be formed. Different beads of fluid conductive material may be formed on different conductive traces 205.

The bead of fluid conductive material is formed at a selected location on one of the conductive traces. The selected location could be an end of one of the conductive traces or any other suitable location. The location is selected to be aligned with holes 213 in a printed circuit board 207.

The bead of fluid conductive material may comprise a drop of fluid conductive material that is formed on the flexible surface. The bead of fluid conductive material may comprise a blob of fluid conductive material. The conductive material that forms the bead of fluid conductive material is viscous enough so that it forms a bead on the flexible surface 203 and does not spread over the flexible surface 203. The conductive material that forms the bead of fluid conductive material is viscous enough so that the bead can be positioned in a precise location relative to the conductive traces 205 and will not spread out to create unwanted connections between conductive traces 205. However the conductive material is fluid enough so as to enable the fluid conductive material to flow through a hole in a printed circuit board 207. In some examples the bead of fluid conductive material could be formed from a paste or any other suitable type of material.

The bead of fluid conductive material may be formed on the conductive trace 205 so that the bead is in direct contact with the conductive trace 205. The bead of fluid conductive material may be formed on the conductive trace 205 so that there are no other elements or components between the bead of fluid conductive material and the conductive trace 205. The bead of fluid conductive material may be formed on the conductive trace 205 so that a path for direct current is provided between the bead of fluid conductive material and the conductive trace 205.

The bead of fluid conductive material may comprise any suitable material. In some examples the bead of fluid conductive material comprises the same material as the conductive trace that the bead of fluid conductive material is formed on. This may ensure that there is good material compatibility between the bead of fluid conductive material and the conductive trace 205. This may improve adhesion between the bead of fluid conductive material and the conductive trace 205.

The second process that is used to form the bead of fluid conductive material is a different process to the first process that is used to form the conductive trace 205. The different process may comprise a different technique for depositing the material compared to the technique that is used for the printing of the traces. The second process comprises a process which enables the bead of fluid conductive material to be deposited at a selected location. The second process may enable precise locations of the beads of fluid conductive material to be selected. The second process can be used to cover small precise areas rather than to cover areas across the flexible surface 203. The second process may be slower than the first process. In some examples the second process comprises at least one of depositing, dispensing, stencil printing or any other suitable process.

The method also comprises, at block 105, positioning at least one printed circuit board 207 overlaying the at least one bead of fluid conductive material such that the at least one bead of fluid conductive material is aligned with at least one hole 213 in the printed circuit board 207.

The printed circuit board 207 may be a flexible printed circuit board. The printed circuit board 207 may be configured so that the printed circuit board 207 changes shape when a force is applied to an apparatus 201 which causes deformation of the flexible surface 203.

The printed circuit board 207 may be configured to enable electronic components 217 to be mounted on the printed circuit board 207. The electronic components mounted on the printed circuit board 207 could comprise sensitive components or components which are likely to be damaged if they were mounted on the flexible surface 203. For example, the components may comprise transistors, integrated circuits or sensors or any other type of components. The components could comprise components which are not suitable to be provided on the flexible surface 203. The components could be mounted on the printed circuit board 207 before the printed circuit board 207 is coupled to the flexible surface 203. This could enable the components to be mounted on the printed circuit board 207 using processes that are not suitable to use for the flexible surface 203. For example, the processes used to mount the components on the printed circuit board 207 could involve temperatures and/or chemicals that could damage the flexible surface 203.

In some embodiments the printed circuit board 207 may comprise a material such as copper or other metallic material. In some embodiments the printed circuit board 207 may comprise non-metallic materials such as silicon, polyethylene terephthalate (PET), PEN, polyimide or any other suitable material. The printed circuit board 207 could comprise a different material to the material used for the flexible surface 203.

The printed circuit board 207 comprises one or more holes 213. The holes may be conductive in that a conductive material defines at least part of the edge of the hole 213. The conductive hole 213 could be formed from copper or any other suitable material. The conductive hole 213 provides a through-hole via.

The holes 213 may be provided in any suitable location within the printed circuit board 207. The holes 213 may be sized so that they have a width that is smaller than the diameter of the bead of fluid conductive material. This size of the hole 213 may ensure that the fluid conductive material is pushed through the hole 213 when the printed circuit board 207 is pushed towards the flexible surface 203.

The method also comprises, at block 107, pushing the printed circuit board 207 towards the flexible surface 203 so as to force the bead of fluid conductive material through the hole 213 to form an electrical connection 211 between the at least one conductive trace 203 and an upper surface of the printed circuit board 207. Any suitable means may be used to push the printed circuit board 207 towards the flexible surface 203.

When the printed circuit board 207 is pushed towards the flexible surface 203 this applies a force to the bead of fluid conductive material which causes the fluid to be pushed through the hole 213. The bead of fluid conductive material is pushed through the hole 213 so as to provide a path of conductive material between an upper surface of the printed circuit 207 board to a lower surface of the printed circuit board 207. This enables the printed circuit board 207 to be electrically connected to the conductive trace 205 on the flexible surface 203.

It is to be appreciated that in some examples the method may comprise additional steps that are not shown in FIG. 1. For instance, in some examples the method could also comprise providing adhesive on an underside of the printed circuit board 207. This may help to hold the printed circuit board 207 in position relative to the flexible surface 203. This could be useful in examples where there are only a small number of holes 213 and connections 211 through the holes 213 in the printed circuit board 207.

In some examples the alignment of the printed circuit board 207 and its holes 213 with respect to the beads of conductive material could be facilitated by using a mask placed on the flexible surface 203. The mask could constrain where the printed circuit board 207 can be placed.

In some examples the method could also comprise curing the fluid conductive material to provide a fastening between the at least one printed circuit board 207 and the flexible material 203. Once the fluid conductive material has been cured this provides a solid interconnection from the printed circuit board 207 to the conductive trace 205. This helps to fasten the printed circuit board 207 to the flexible material 203. In such examples the conductive material that is provided through the holes 213 in the printed circuit board 207 provides dual functionality in that it provides a conductive connection and also provides a fastening.

The example method therefore provides a method of forming electrical connections 211 between conductive traces 205 on flexible surfaces 203 and printed circuit boards 207. The use of different processes for forming the conductive traces 205 and the beads of fluid conductive material that form the electrical connections 211 provide efficient processes for forming the different parts of the respective electrical connections 211. This also enables the same material to be used to form the electrical connection 211 through the holes 213 in the printed circuit board 207 as is used for the conductive traces 205. This can help to improve the adhesive properties of the electrical connection 211 and help to fasten the printed circuit board 207 to the flexible surface 203.

The example method also enables the electrical connections 211 to be formed without the need for any lithographic techniques. This therefore reduces the labour required to fabricate the apparatus 201 and provides for a scalable manufacturing process.

FIG. 2 is a plan view of an example apparatus 201 which could be formed using the example method of FIG. 1. The apparatus 201 comprises a flexible surface 203, a plurality of conductive traces 205 and a plurality of printed circuit boards 207. It is to be appreciated that the apparatus 201 could also comprise additional components that are not shown in FIG. 2. For example the apparatus 201 could comprise a power source or any other suitable components.

In the example of FIG. 2 a plurality of conductive traces 205 are provided on the flexible surface 203. Five conductive traces 205 are shown in FIG. 2. In other examples other numbers of conductive traces 205 can be used. In some examples a single conductive trace 205 could be used.

In the example of FIG. 2 the conductive traces 205 comprise elongate members. The elongate members are coupled to a printed circuit board 207 at one end. The other end of the elongate member can be attached to any other suitable component. For instance, in the example of FIG. 2 three of the conducive traces 205 have one end coupled to a conductive foam 215. The conductive foam 215 can enable the conductive traces 205 to be coupled to a subject or to other components. Also in the example of FIG. 2 one of the conductive traces 205 has one end coupled to a first printed circuit board 207 and the other end coupled to a second printed circuit board 207. This can provide electrical connectivity between the components on the two different printed circuit boards 207.

In the example embodiment of FIG. 2 the conductive traces 205 are curved. The total length of a curved conductive trace 205 is greater than the length of the flexible surface 203 over which the conductive trace 205 extends. In the example of FIG. 2 the conductive traces 205 form a sinusoidal, or substantially sinusoidal, shape. This may enable the conductive traces 205 to be deformed or stretched as needed. Other shapes for the conductive traces 205 can be used in other examples of the disclosure.

In the example of FIG. 2 all of the conductive traces 205 have the same or a similar shape. In other examples different shapes of conductive traces 205 can be used. In some examples different shapes of conductive traces 205 can be used within the same apparatus 201. For instance some of the conductive traces 205 could have a sinusoidal shape as shown in FIG. 2 while other conductive traces 205 could comprise a straight line or any other suitable shape.

The printed circuit boards 207 are positioned overlaying at least part of the conductive traces 205. In the example of FIG. 2 the printed circuit boards 207 are positioned to overlay ends of the conductive traces 205. When the apparatus 201 is being formed the bead of fluid conducive material is provided at the end of the conductive trace 205 which is to be covered by the printed circuit boards 207.

In the example of FIG. 2 the apparatus 201 comprises two printed circuit boards 207. It is to be appreciated that in other examples the apparatus 201 could comprise a different number of printed circuit boards 207. For instance the apparatus 201 could comprise only one printed circuit board 207 or could comprise more than two printed circuit boards 207.

The printed circuit boards 207 comprise a plurality of electronic components 217. The electronic components 217 could be any suitable type of components. In some examples the electronic components 217 could comprise sensors, transducers, processors or any other suitable components. The electronic components 217 are provided on an upper surface of the printed circuit boards 207. The electronic components 217 are provided on a surface of the printed circuit boards 207 which is opposite to the surface facing the flexible surface 203.

The printed circuit board 207 comprises a plurality of holes 213. In the example of FIG. 2 each of the printed circuit boards 207 comprise a plurality of holes 213. The holes 213 may be located at any suitable position within the printed circuit board 207. The holes may be located far enough away from the edges of the printed circuit boards 207 so as to prevent tearing when the apparatus 201 is bent or otherwise deformed. The holes 213 provide a discontinuity in the printed circuit boards 207 which extends from the upper surface of the printed circuit boards 207 to a lower surface.

When the apparatus 201 is being formed the printed circuit boards 207 are positioned overlaying the conductive traces 205 so that the holes in the printed circuit board 207 are aligned with the beads of fluid conductive material. This enables the beads of fluid conductive material to be pushed through the holes 213 to create the electrical connections 211. The electrical connections 211 extend from the conductive traces 205 through a hole 213 in the printed circuit board 207. The electrical connections 211 were formed by pushing the bead of fluid conductive material from the conductive trace 205 through the hole 213. The electrical connections 211 may have been formed using the method shown in claim 1.

FIG. 3 is a cross section of the example apparatus 201 shown in FIG. 2. The cross section is taken through the line X-X. Corresponding reference numerals are used for corresponding features.

In the cross section shown in FIG. 3 it can be seen that the hole 213 extends through the entire thickness of the printed circuit board 207. In the example of FIG. 3 the hole 213 extends vertically, or substantially vertically, though the printed circuit board 207 so that the hole 213 extends perpendicular, or substantially perpendicular, to the upper surface of the printed circuit board 207.

The electrical connection 211 extends through the hole 213 from the conductive trace 205 to the upper surface of the printed circuit board 207. The electrical connection 211 extends through the entire length of the hole 213 so as to provide a path for direct current from the upper surface of the printed circuit board 207 to the conductive trace 205 provided underneath the printed circuit board 207.

One or more conductive traces may be provided on the upper surface of the printed circuit board 207 so as to enable the electrical connection 211 to be connected to the electronic components 217. This therefore enables the electronic components 217 on the printed circuit board 207 to be electrically connected to the flexible surface 203.

The electrical connection 211 may also provide a fastening between the flexible surface 203 and the printed circuit board 207. The conductive material that forms the electrical connection 211 could be chemically bonded to the material of the conductive trace 205. For instance, if the same material is used for both the bead of fluid conductive material and the conductive trace 205, this provides for strong chemical bonds between the conductive trace 205 and the electrical connection 211 formed from the bead of fluid conductive material.

In the example shown in FIG. 3 an adhesive coating 301 is provide between the flexible surface 203 and the printed circuit board 207. In some examples the adhesive coating 301 could be provided on an underside of the printed circuit board 207.

The adhesive coating 301 could comprise any material which may assist in fastening the printed circuit board 207 to the flexible surface 203. In some examples the adhesive coating 301 could also provide a protective coating which may help to prevent the conductive traces 205 from being damaged. The adhesive coating 301 could be formed from any suitable material. In some examples the adhesive coating 301 could be formed from a non-conductive material.

A gap may be provided in the adhesive coating 301 so that the bead of fluid conductive material can be pushed through the gap to form the electrical connection 211.

In some examples the adhesive coating 301 might not be provided. For instance, if sufficient numbers of electrical connections 211 are provided across the surface of the printed circuit board 207 then the plurality of electrical connections 211 may be sufficient to hold the printed circuit board 207 in position relative to the flexible surface 203. In some examples only a small number of electrical connections 211 could be provided or they might only be located in a small area. In such examples the adhesive coating 301 can assist the electrical connections 211 in fastening the printed circuit board 207 to the flexible surface 203.

In some examples the apparatus 201 shown in FIGS. 2 and 3 could comprise additional components that are not shown in FIGS. 2 and 3. For instance, an additional protective layer may be provided over the printed circuit boards 207 and the other components of the apparatus 201. In such examples the additional protective layer may be coated over the apparatus 201 after the bead of conductive fluid conductive material has been pushed through the hole 213 to form the electrical connection 211. The additional protective layer may comprise a non-conductive material. The additional protective layer may encapsulate the apparatus 201 and act to protect the conductive traces 205 and/or the electronic components on the printed circuit board 207.

The materials used for the adhesive coating 301 and also any other protective layers could be selected so as to enable the flexible surface 203 to be deformed. For example a flexible polymeric material could be used so that the apparatus 201 is still flexible even after the adhesive coating 301 and any other protective layers have been applied.

In some examples the thickness of the additional protective layer could be selected to control the flexibility of the apparatus 201. The thickness of the additional protective layer could be controlled so that the additional protective layer has different thickness in different places. The areas with greater thickness could be provided in areas where there are electrical components that could be damaged by excessive deforming. For example, the areas with greater thickness could be provided over conductive traces 205 to restrict the flexibility of the areas of the apparatus 201 in which the conductive traces 205 are provided. In some examples this could still allow some deformation of the flexible surface 203 in the areas in which the conductive traces 205 are provided but may make this sections of the apparatus 201 harder to deform compared to other sections of the apparatus 201. In some examples the additional protective layer could have a uniform thickness.

In some examples the apparatus 201 could comprise two flexible surfaces 203. In such examples the apparatus 201 could comprise an upper flexible surface 201 and a lower flexible surface 203 and the printed circuit boards 207 could be sandwiched between the upper flexible surface 201 and the lower flexible surface 203. In some of these example conductive traces 205 could be provided on both of the flexible surfaces 203. In other examples the conductive traces 205 might only be provided on one of the flexible surfaces 203.

FIG. 4 is a plan view of another example apparatus 201. Corresponding reference numerals are used for corresponding features. The apparatus 201 comprises a plurality of conductive traces 205 on a flexible surface 203 and electrical connection 211 connecting the conductive traces 205 to the circuit boards 207. The apparatus 201 may be formed using the method shown in FIG. 1 or any suitable variations of this method.

In the example of FIG. 4 the apparatus 201 comprises a plurality of portions of conductive foam 215. In the example of FIG. 4 three portions of conductive foam 215 are provided. Other numbers of portions of conductive foam 215 could be used in other examples of the disclosure.

The portions of conductive foam 215 may provide electrodes which may enable electrical signals to be provided from or detected from a subject's body. For instance, the portions of conductive foam 215 could enable bio electrical signals to be detected from a subject wearing the apparatus 201 within a wearable electronic device. In some examples the portions of conductive foam 215 could enable a path for direct current between the subject and the conductive traces 205. In some examples 215 the portions of conductive foam 215 could provide for capacitive sensing of the bio electrical signals.

The portions of conductive foam 215 may be positioned within the apparatus 201 so as to enable good electrical connection between the portions of conductive foam 215 and the subject wearing the apparatus 201. For instance, in some examples the portions of conductive foam 215 could be raised so that they protrude out of the flexible surface 203.

The portions of conductive foam 215 are connected to one end of a conductive trace 205. The other end of the conductive trace 205 is connected to the printed circuit board 207 via an electrical connection 211. This enables the conductive foam 215 to be electrically connected to the electrical components 217 on the printed circuit board 207. This may therefore enable data signals obtained by the conductive foam 215 to be processed and/or stored by the electrical components 217 on the printed circuit board 207. This may enable the apparatus 201 to be used to monitor bio signals from a subject.

The conductive foam 215 could be connected to the conductive trace 205 using any suitable means. In some examples the conductive foam 215 could be coupled directly to the conductive trace 205. In other examples the conductive foam 215 could be adhered to the conductive trace 205 and then an electrically conductive fabric could be adhered to the conductive foam 215. This may help the conductive fabric to protrude out of the flexible surface 203. In other examples the conductive fabric could be adhered directly to the conductive trace 205. The use of the conductive fabric may also make the apparatus 201 more resistant to abrasions and bending stress.

In some examples the electronic components 217 provided on the printed circuit board 207 could comprise a transceiver which could enable wireless communication. The wireless communication could be Bluetooth, WiFi, or any other suitable wireless communication. This may enable data obtained from the bio signals to be transmitted to other devices. For example it may enable the data to be transmitted to a remote server and/or a cloud network.

In the example of FIG. 4 the apparatus 201 also comprises a feedback device 401, a power source 403, snap connectors 405 and an additional protective layer 407. It is to be appreciated that this is just an example apparatus 201 and that in other implementations some of these components could be omitted and/or other components could also be used.

The feedback device 401 could comprise any means which provides an output that can be perceived by a subject using the apparatus 201. In the example of FIG. 2 the feedback device 401 is a haptic feedback device. This provides an output that the subject wearing the apparatus 201 can perceive through their sense of touch. For example the haptic feedback device could provide a vibration or a deformation that can be sensed though the subjects' skin. The feedback device 401 could comprise a piezoelectric portion, a vibration motor, electroactive polymers or any other suitable means for providing haptic feedback.

The feedback device 401 may be positioned within the apparatus 201 so that when a subject is wearing the apparatus 201 the feedback device 401 is positioned close to the skin of the subject. This ensures that the subject can detect the haptic feedback provided by the feedback device 401. Other types of feedback device 401 could be used in other examples of the disclosure.

The feedback device 401 could be provided on a printed circuit board 207. A conductive trace 205 may be provided between the printed circuit board 207 comprising the feedback device 401 and the printed circuit board 207 comprising the other electronic components 217. The conductive trace 205 may be electrically connected to the printed circuit boards 207 via the electrical connections 211 formed from the beads of fluid conductive material. An electrical connection 211 is provided at each end of the conductive trace 205 so as to enable the same conductive trace 205 to be connected to two different printed circuit boards 207. This may enable signals to be provided from the other electronic components 217 to the feedback device 401.

The power source 403 could comprise any means which may be configured to provide electrical power to the apparatus 201. In some examples the power source 403 could comprise a battery such as a thin film battery or a printed battery. In some examples the power source 403 could be flexible so as to enable the power source 403 to be bent or otherwise deformed when the apparatus 201 is bent or otherwise deformed. The power source 403 could be a rechargeable power source.

One or more conductive traces 205 may be provided between the power source 403 and the printed circuit board 207 comprising the electronic components 217. The conductive trace 205 may be electrically connected to the printed circuit board 207 and the power source 403 via the electrical connections 211 formed from the beads of fluid conductive material. An electrical connection 211 is provided at each end of the conductive trace 205 so as to enable the same conductive trace 205 to be connected to the printed circuit board 207 and also the power source 403. This enables power to be provided from the power source 403 to the electronic components 217 and any other components of the apparatus 201.

The example apparatus 201 shown in FIG. 4 also comprises a set of snap connectors 405. The snap connectors 405 may enable a supplementary power source to be connected to the apparatus 201 so as to enable the power source 403 to be recharged. A plurality of conductive traces 205 are provided between the snap connectors and the power source 403. Examples of snap connectors 405 that can be used in some examples of the disclosure are shown in more detail in FIGS. 5A to 5D.

In the example of FIG. 4 the apparatus 201 also comprises an additional protective layer 407. The additional protective layer 407 may be provided over components which need to be protected. The additional protective layer 407 may be selectively coated onto selected areas of the apparatus 201 so as to reduce, or minimise, the material used.

In the example of FIG. 4 the additional protective layer 407 is provided overlaying the conductive traces 205, the conductive foam 215, the printed circuit boards 207, the feedback device 401, the power source 403 and the snap connectors 405. In other examples the additional protective layer 407 could be provided overlaying just a subset of these components. For example, the additional protective layer 407 could be provided over the most sensitive components. The areas of the flexible surface 203 that do not comprise these components are not covered.

FIGS. 5A to 5D show example snap connectors 405, 501 that may be used with the apparatus 201. The snap connectors 405, 501 could be used to enable a supplementary power source to recharge the power source 403 of the apparatus 201. The snap connectors 405, 501 enable the supplementary power source to be temporarily attached to the apparatus 201.

Figures 5A, 5B:
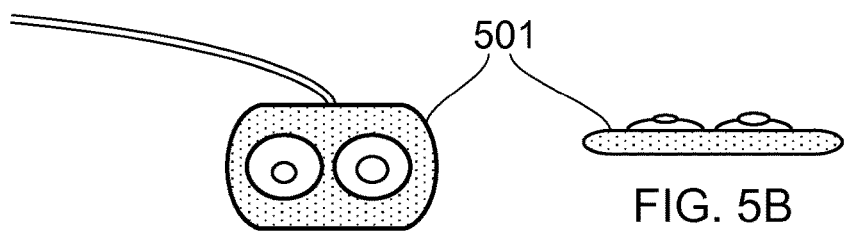
Figures 5C, 5D:
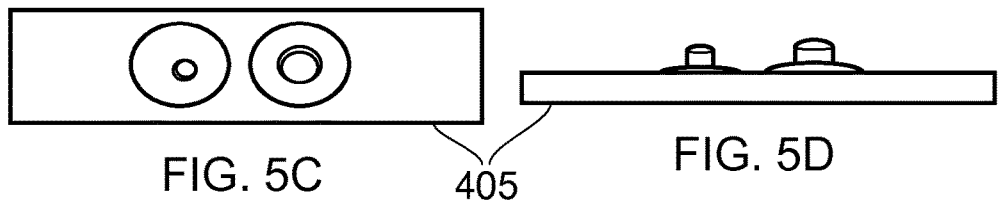

FIGS. 5A and 5B show the female snap connectors 501 and FIGS. 5C and 5D show the male snap connectors 405. FIGS. 5A and 5C show top views of the snap connectors 405, 501. And FIGS. 5B and 5D show side views of the snap connectors 405, 501.

The male snap connectors 405 could be embedded into the flexible surface 203 as shown in FIG. 4. The male snap connectors 405 could be embedded into the flexible surface 203 using any suitable means. In some examples the male snap connectors 405 could be bonded to the flexible surface 203 using an adhesive. In some examples the male snap connectors 405 could be stitched to the flexible surface or attached using any other suitable fastening. In other examples of the disclosure the female snap connectors 501 could be provided in the flexible surface 203 while the male snap connectors 405 could be connected to the supplementary power source.

The female snap connectors 501 are configured to be attached to the male snap connectors 405 to provide a path for direct current from the female snap connectors 501 to the male snap connectors 405. The snap connectors 401, 501 have different sizes to ensure that the female snap connectors 501 can only be attached to the male snap connectors 405 in the right polarity. It is to be appreciated that other means for temporarily attaching a power source to the apparatus 201 could be used in other examples of the disclosure.

FIGS. 6A to 6G show an example method of an apparatus 201 being fabricated. The apparatus 201 that is fabricated in FIGS. 6A to 6G comprises two flexible printed circuit boards 207 and three conductive traces 205 extending between the two flexible printed circuit boards 207.

In the example of FIGS. 6A to 6G the flexible surface 203 comprise a fabric. The fabric has a composition of 80% polyamide and 20% Lycra. This provides for a stretchable fabric. Other types of material could be used for the flexible surface 203 in other examples of the disclosure.

Figure 6A:
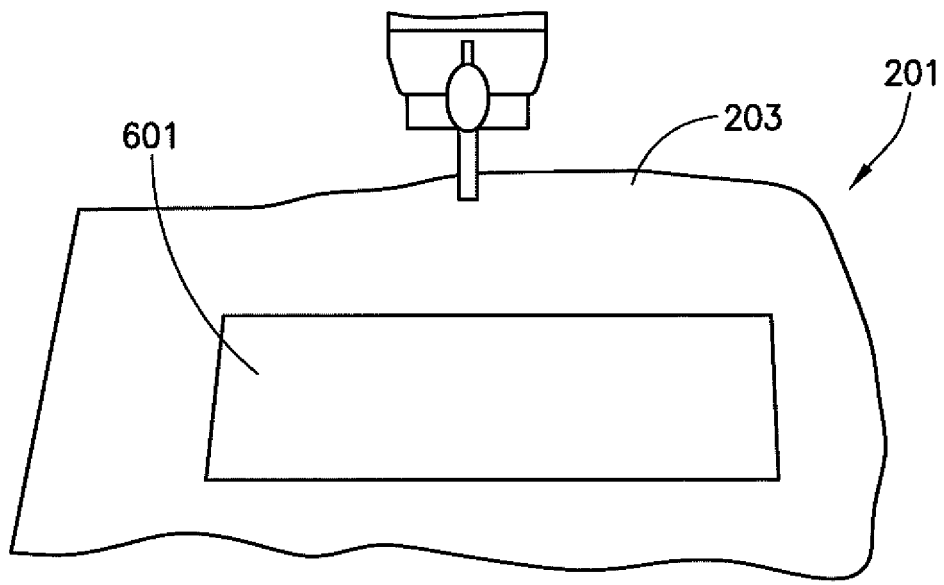

In FIG. 6A a base layer 601 is deposited on the flexible surface 203. The base layer 601 could comprise a non-conductive material such as polyurethane. The base layer 601 could be spray coated onto the flexible surface 203. Other methods of depositing the base layer 601 could be used in other examples of the disclosure.

Once the base layer 601 is deposited on the flexible surface 203 the base layer 601 is dried at 80° C. for five minutes.

Figure 6B:
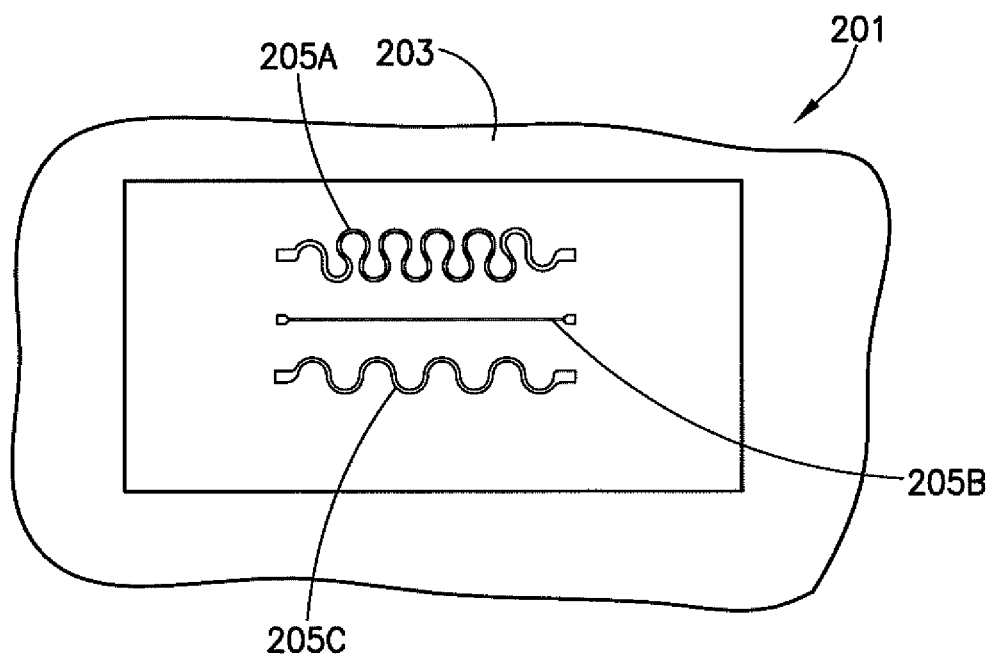

In FIG. 6B three different shaped conductive traces 205 are formed on the flexible surface 203. In the example of FIG. 6B the conductive traces 205 are formed by screen printing a stretchable silver ink onto the flexible surface 203. Once the silver ink has been printed the conductive traces 205 are cured at 120° C. for fifteen minutes.

In the example of FIG. 6B three different conductive traces 205 are shown. The different conductive traces 205 have different shapes. In the first conductive trace 205A the curved portions of the conductive trace 205A have an angle of curvature greater than 180 degrees so that the conductive trace 205A doubles back on itself to form a series of loops. The loops comprise openings so the loops are not closed. The plurality of loops form a serpentine shape in which serpentine shape in which a loop which extends in a first direction is followed by a loop which extends in an opposite direction.

The second conductive trace 205B comprises a straight line, or a substantially straight line.

The third conductive trace 205C comprises a sinusoidal or substantially sinusoidal shape. In this trace the angle of curvature is smaller than the angle of curvature of the first trace. It is to be appreciated that other shapes of conductive traces 205 could be used in other examples of the disclosure.

In the example of FIG. 6B the flexible surface 203 is in a flat or substantially flat configuration while the conductive traces 205 are being formed. In other examples the flexible surface 203 may have a different shape while the conductive traces 205 are being formed. For example it may be curved or any other suitable shape.

Figure 6C:
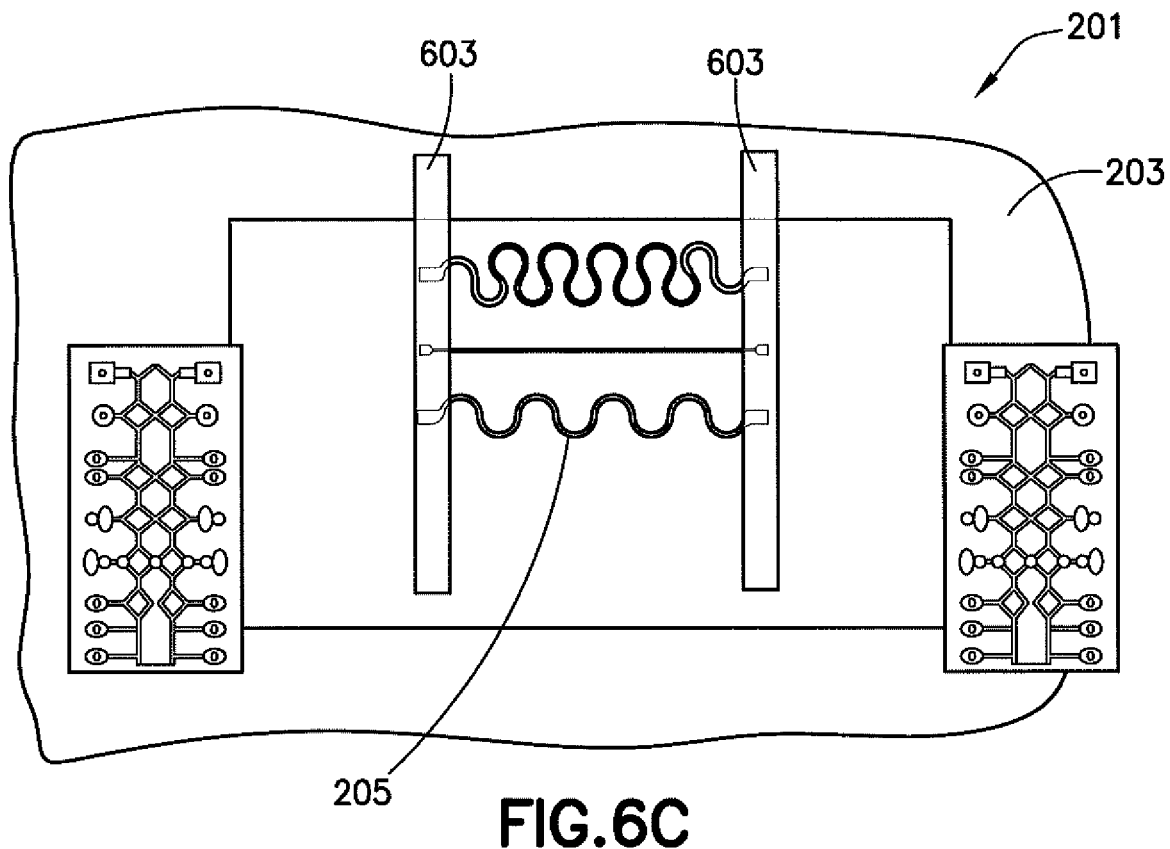

In FIG. 6C a mask 603 is applied to the flexible surface 201 before an adhesive coating 301 is formed. The mask 603 covers the ends of the conductive traces 205 so that the adhesive coating 301 does not cover the ends of the conductive traces 205. In the example of FIG. 6C the mask 603 comprises two rectangular portions of PEN (Polyethylene naphthalate). Other materials could be used in other examples of the disclosure.

The adhesive coating 301 is then formed on the flexible surface 203 by spray coating a layer of polyurethane dispersion. The layer is then dried at 80° C. for five minutes.

In other examples the adhesive coating 301 could be formed by selectively spray coating a pattern or by any other suitable means.

Figure 6D:
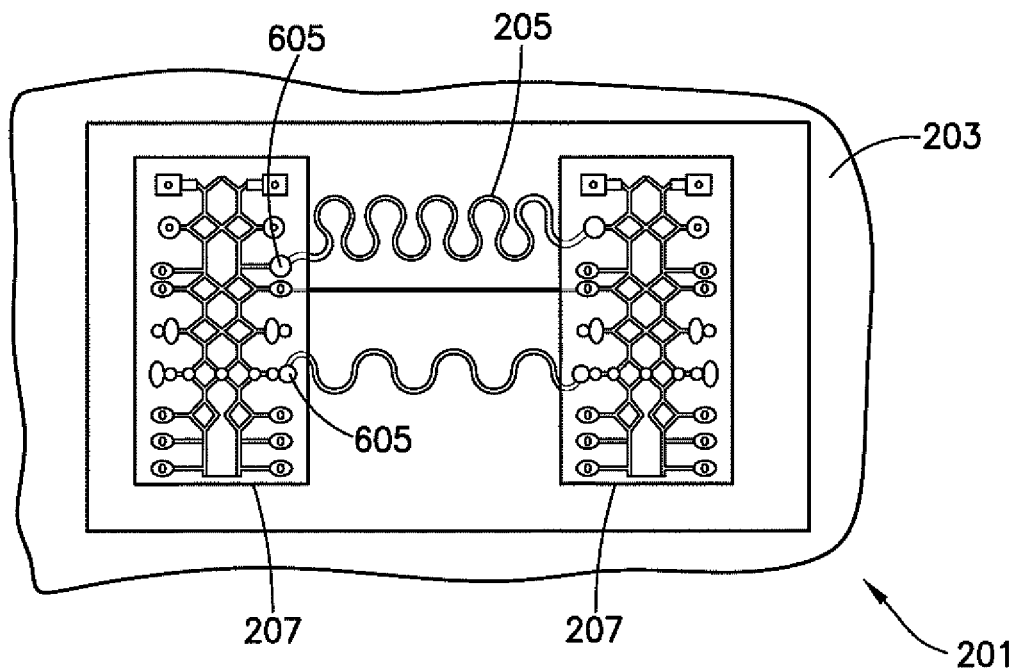

In FIG. 6D a bead of fluid conductive material 605 is deposited at the ends of each of the conductive traces 205. In the example of FIG. 6D the beads of fluid conductive material 605 could be formed from silver so that the beads of conductive material 605 comprises the same material as the conductive traces 205. The printed circuit boards 207 are then positioned over the beads of fluid conductive material 605 so that holes 213 in the printed circuit boards 207 are aligned with the beads of fluid conductive material 605.

Once the printed circuit boards 207 are aligned with the beads of fluid conductive material 605 the printed circuit boards 207 are pushed towards the flexible surface 203. In the example of FIG. 6D the printed circuit boards 207 are pushed down into the flexible surface 203. The printed circuit boards 207 are pushed towards the flexible surface 203 so as not to leave any gap between the printed circuit boards 207 and the flexible surface 203. The pushing of the printed circuit boards 207 towards the flexible surface causes the bead of fluid conductive material 605 to be pushed upwards through the holes 213 in the printed circuit boards 207. Once the bead of fluid conductive material 605 has been cured this provides a secure attachment of the printed circuit boards 207 to the flexible surface 203.

Figure 6E:
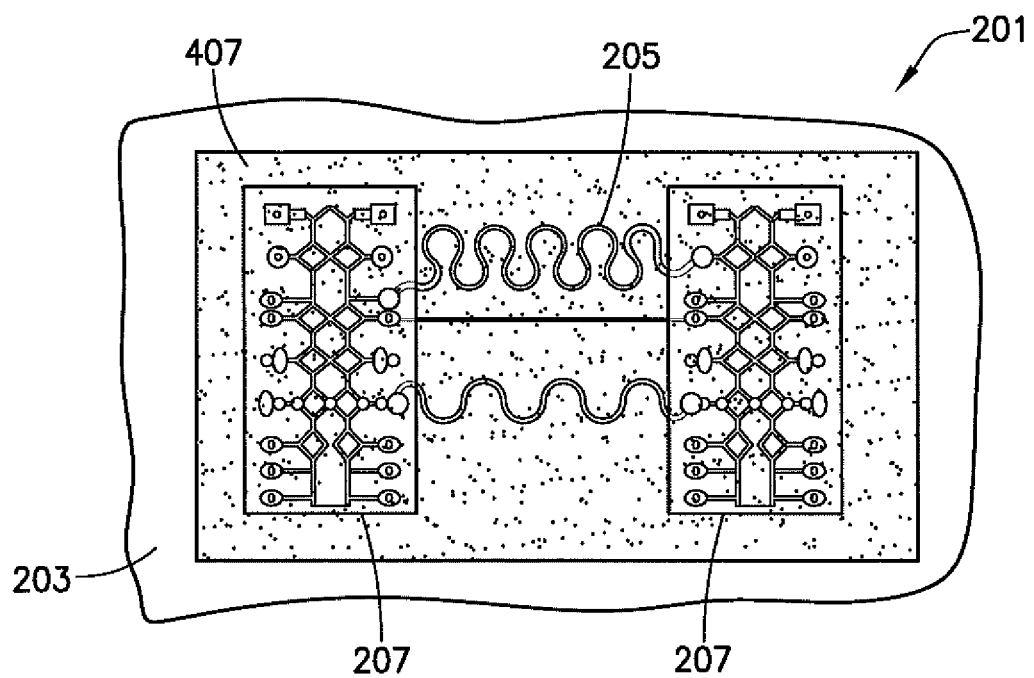

In FIG. 6E an additional protective layer 407 is formed over the conductive traces 205 and the printed circuit boards 207. In the example of FIG. 6E the additional protective layer could be formed by spray coating a non-conductive material over the conductive traces 205 and the printed circuit boards 207. This additional protective layer 407 may assist with securing the printed circuit boards 207 to the flexible surface 203.

In the example of FIG. 6E the additional protective layer 407 is spray coated so that the additional protective layer 407 is thicker in the areas overlaying the printed circuit boards 207. This may make it harder to deform the areas of the apparatus 201 comprising the printed circuit boards 207. This may mean that a larger force is required to deform the printed circuit boards 207 than is required to deform other parts of the apparatus 201. This may help to prevent delamination of the printed circuit boards 207 and/or damage to the electrical components 217 provided on the printed circuit boards 207.

Figure 6F:
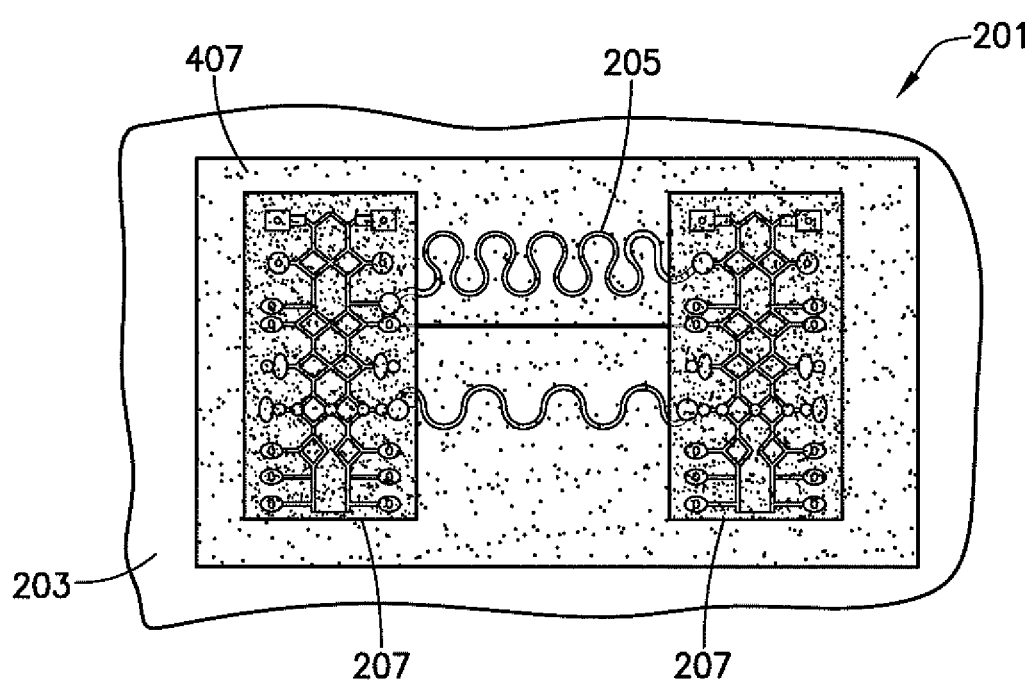

In FIG. 6F the additional protective layer 407 was dried at 80° C. for five minutes.

The completed apparatus 201 is shown in FIG. 6G. The apparatus 201 can be bent as shown in FIG. 6G where the apparatus 201 is being squeezed between the user's fingers. Other deformations could be made in other examples of the disclosure.

The deformation of the apparatus 201 does not cause damage to the apparatus 201 because the electrical connections 211 provide secure connections which help to fasten the printed circuit boards 207 to the flexible surface 203.

In the example of FIGS. 6A to 6G additional protection can be provided to components 217 on the printed circuit boards 207 by providing a thicker layer of the additional protective layer 407 over the printed circuit boards 207. In other examples the additional protection could be provided by using rigid printed circuit boards 207. The rigid printed circuit boards 207 may only cover a small area of the apparatus 201 so that the apparatus 201 is still generally flexible.

FIGS. 7A to 7F show FIGS. 7A to 7F show another example method of an apparatus 201 being fabricated. The apparatus 201 that is fabricated in FIGS. 7A to 7F also comprises two flexible printed circuit boards 207 and three conductive traces 205 extending between the two flexible printed circuit boards 207.

In the example of FIGS. 7A to 7F the flexible surface 203 comprises a polymeric material. In the example of FIGS. 7A to 7E the polymeric material is a transparent or partially transparent material. In the example of FIGS. 7A to 7F the polymeric material comprises PEN. Other types of polymer could be used in other examples of the disclosure. The flexible surface 203 could comprise a carrier substrate that is removed before the final apparatus 201 is assembled.

Figure 7A:
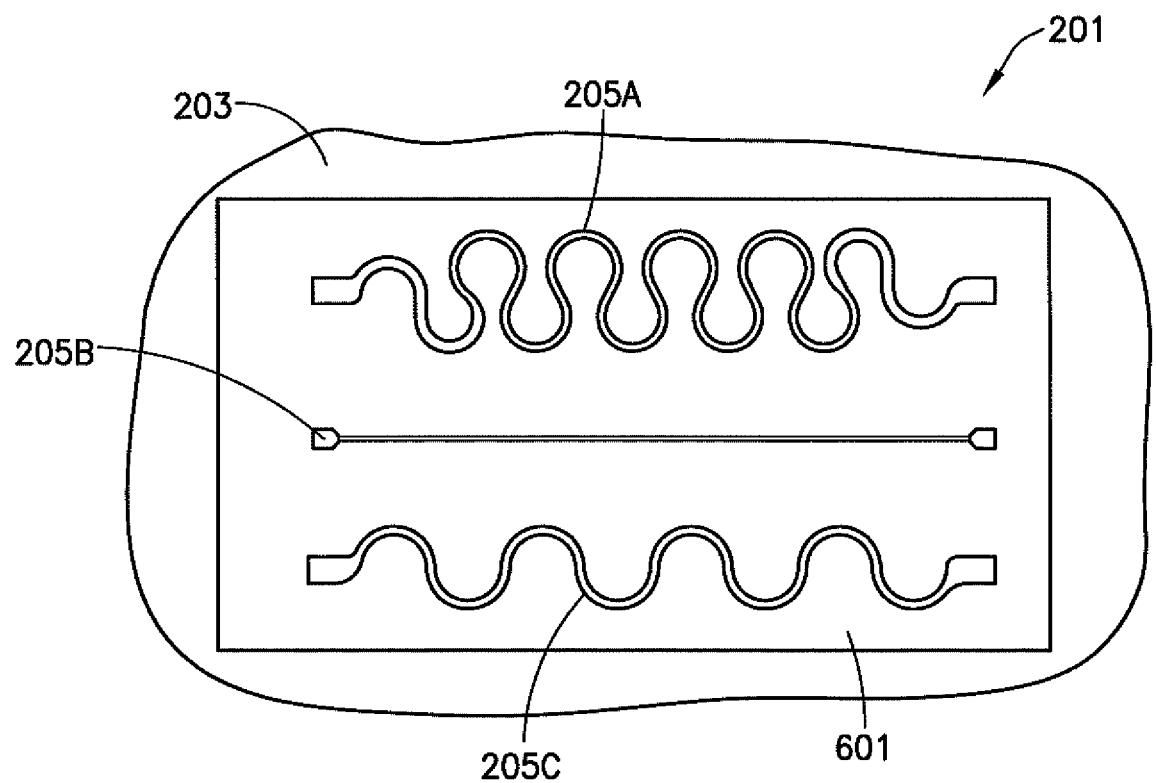

In FIG. 7A a base layer 601 is deposited on the flexible surface 203. The base layer 601 could comprise a non-conductive material such as polyurethane. The base layer 601 could be spray coated onto the flexible surface 203. Other methods of depositing the base layer 601 could be used in other examples of the disclosure.

Once the base layer 601 is deposited on the flexible surface 203 the base layer 601 was dried before the conductive traces 205 were printed over the base layer 601. In FIG. 7A three different shaped conductive traces 205 are formed on the flexible surface 203 which have the same shapes as the conductive traces 205 shown in FIGS. 6A to 6G. In the example of FIG. 7A the conductive traces 205 are formed by screen printing a stretchable silver ink onto the flexible surface 203. Once the silver ink has been printed the conductive traces 205 are cured at 120° C. for fifteen minutes.

Figure 7B:
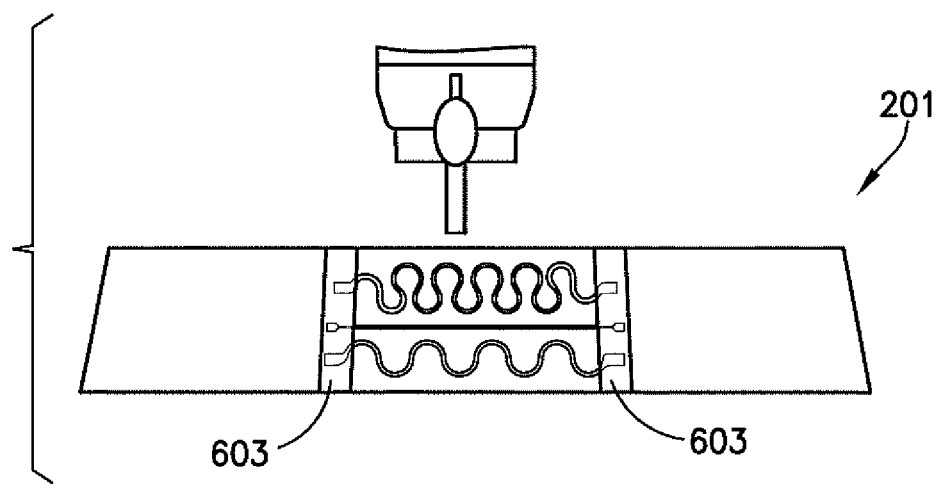

In FIG. 7B a mask 603 is applied to the flexible surface 201 before an adhesive coating 301 is formed. The mask 603 covers the ends of the conductive traces 205 so that the adhesive coating 301 does not cover the ends of the conductive traces 205. In the example of FIG. 7B the mask 603 comprises two rectangular portions of PEN (Polyethylene naphthalate). Other materials could be used in other examples of the disclosure.

The adhesive coating 301 is then formed on the flexible surface 203 by spray coating a layer of polyurethane dispersion. The layer was then dried at 80° C. for five minutes.

Figure 7C:
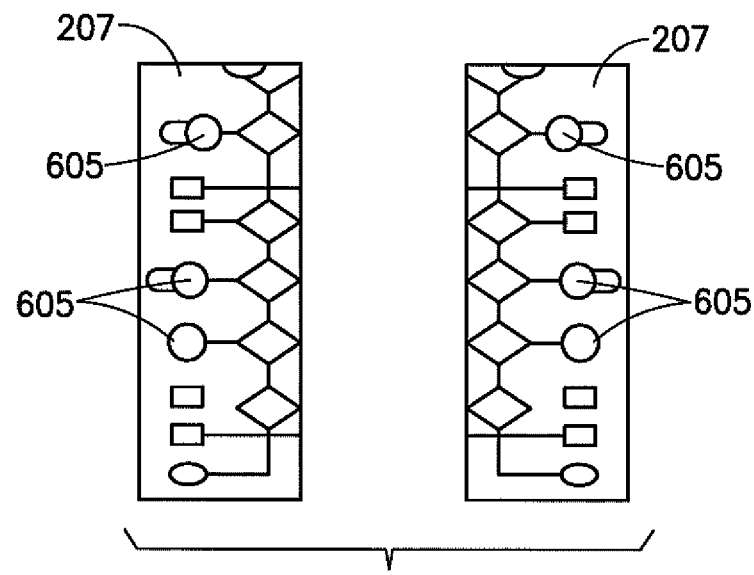

In FIG. 7C a bead of fluid conductive material 605 is deposited at a location on an underside of the printed circuit boards 207. The beads of fluid conductive material 605 are deposited on the underside of the printed circuit boards 207 in the locations over the holes in the printed circuit boards 207. The bead of fluid conductive material 605 may be viscous enough so that the bead of fluid conductive material 605 does not flow through the holes 213 until an additional force is applied by pushing the printed circuit boards 207 into the flexible surface 203. The method shown in FIGS. 7A to 7E is therefore different to the method shown in FIGS. 6A to 6G where the beads of fluid conductive material 605 are formed on the conductive traces 203 rather than on the underside of the printed circuit boards 207.

Figure 7D:
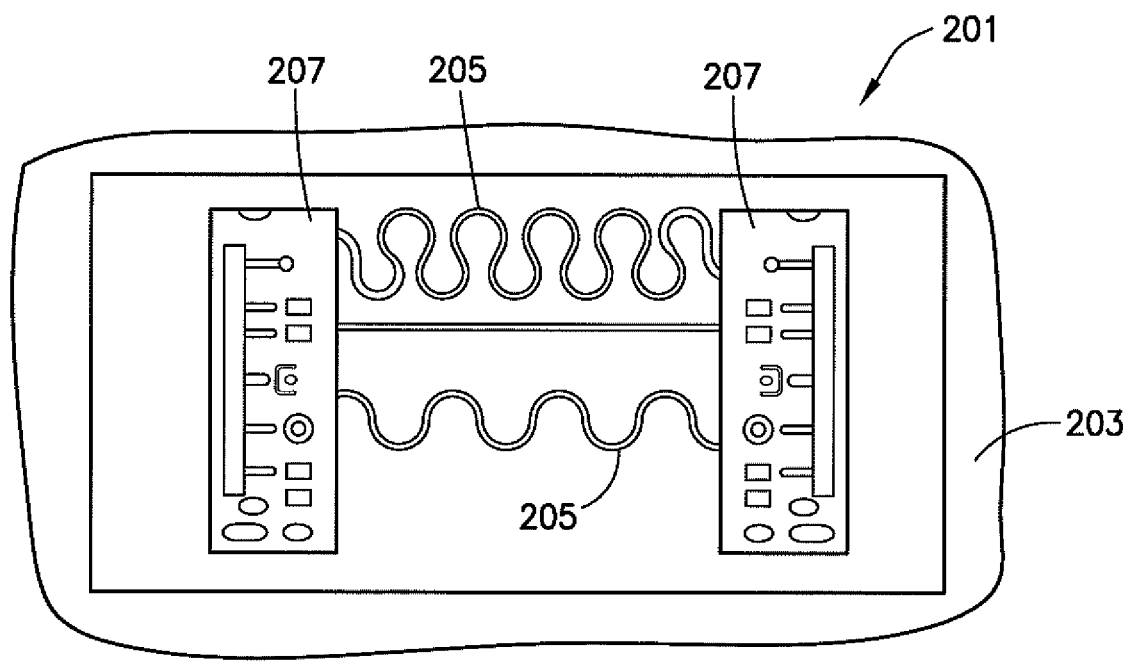

In FIG. 7D the printed circuit boards 207 are then positioned over the ends of the conductive traces 205 so that the beads of fluid conductive material 605 and the holes 213 in the printed circuit boards 207 are aligned with the ends of the conductive traces 205.

Once the printed circuit boards 207 are aligned positioned over the ends of the conductive traces 205 the printed circuit boards 207 are pushed towards the flexible surface 203. In the example of FIG. 7C the printed circuit boards 207 are pushed down into the flexible surface 203. The printed circuit boards 207 are pushed towards the flexible surface 203 so as not to leave any gap between the printed circuit boards 207 and the flexible surface 203. The pushing of the printed circuit boards 207 towards the flexible surface causes the bead of fluid conductive material 605 to be pushed upwards through the holes in the printed circuit boards 207. Once the bead of fluid conductive material 605 has been cured this provides a secure attachment of the printed circuit boards 207 to the flexible surface 203.

An additional protective layer 407 is formed over the conductive traces 205 and the printed circuit boards 207. In the example of FIG. 7D the additional protective layer could be formed by spray coating a non-conductive material over the conductive traces 205 and the printed circuit boards 207 and then being dried at 80° C. for five minutes.

Figure 7E:
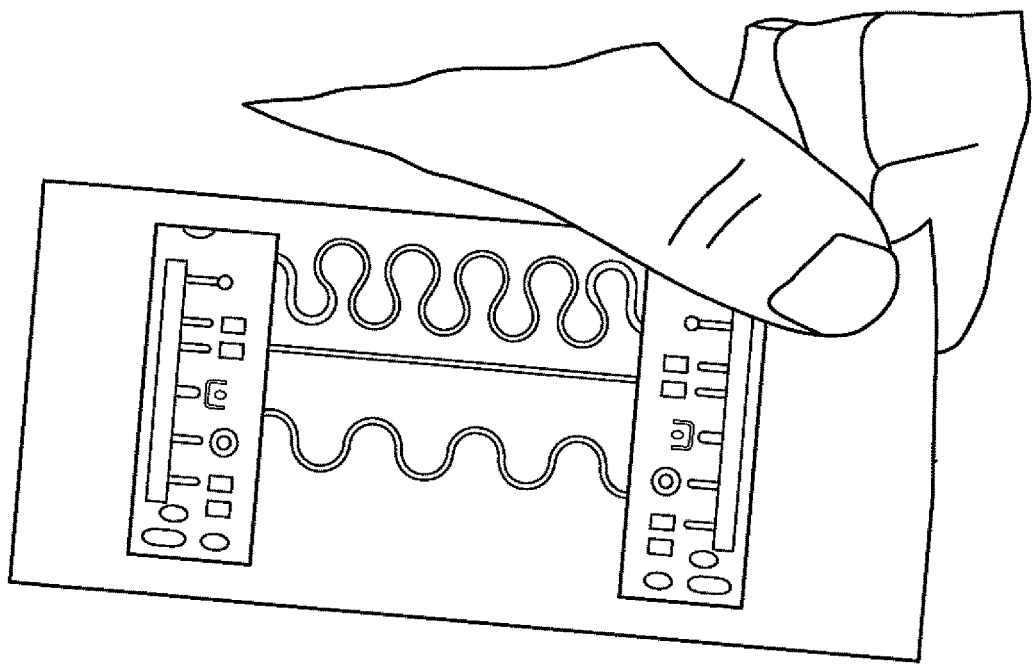
Figure 7F:
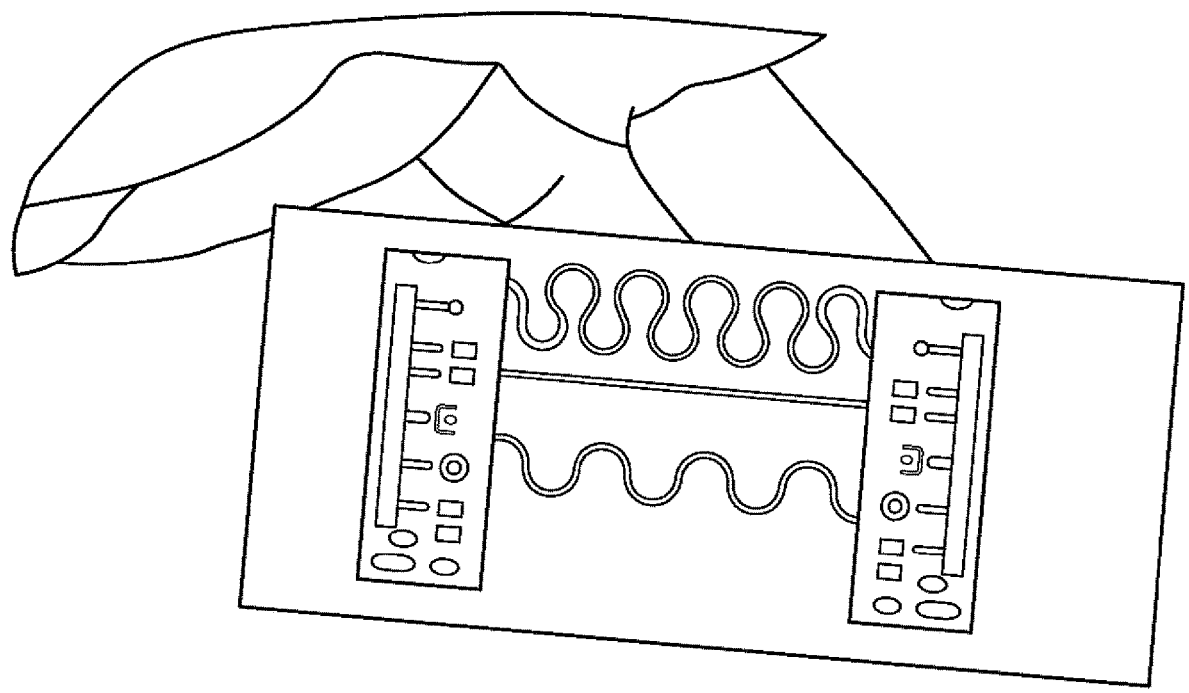

In FIG. 7E the conductive traces 205 and the printed circuit boards 207 are then peeled off the flexible surface 203. The carrier substrate that provided the flexible surface 203 can then be discarded as shown in FIG. 7F. The conductive traces 205 and the printed circuit boards 207 can then be transferred to another flexible surface. For example the conductive traces 205 and the printed circuit boards 207 could be transferred to a fabric surface or a paper surface or any other suitable surface.

The use of the carrier substrates may the conductive traces 205 and the printed circuit boards 207 and other components of the apparatus 201 to be exposed to conditions during the fabrication process that could damage the material of the completed apparatus 201. For example it may enable the apparatus 201 to be exposed to chemical and/or temperatures could damage a fabric or paper surface.

FIGS. 8A and 8B show a wearable electronic device 801 comprising an example apparatus 201. The example apparatus 201 could be as shown in FIG. 4, for example the apparatus 201 could comprise 201 a plurality of conductive traces 205 and a plurality of printed circuit boards 207. The 201 could also comprise additional components such as, portions of conductive foam 21, a feedback device 401, a power source 403, snap connectors 405 and/or any other suitable components.

In the examples of FIGS. 8A and 8B the wearable electronic device 801 comprises a sleeve 805 which can be worn on a subject's arm 803. FIG. 8A shows the inner surface of the sleeve 805 and FIG. 8B shows the sleeve 805 being worn by the subject.

In the example of FIGS. 8A and 8B the sleeve 805 comprises a flexible material such as lycra which can be stretch to fit tightly around the subject's arm or other part of the subject's body. Other materials can be used in other examples of the disclosure.

The conductive traces 205 and the printed circuit boards 207 and the other components of the apparatus 201 are provided on the inner surface of the sleeve so that when the wearable electronic device 801 is being worn by a subject these components are provided adjacent to, or in direct contact with, the subject's skin. The wearable electronic device 801 may be configured to bend and stretch as the subject puts the wearable electronic device 801 on and when the subject takes the wearable electronic device 801 off again. The wearable electronic device 801 may also bend and stretch as the wearable electronic device 801 is being worn, for example, if the subject moves their arm. The electrical connection 211 formed using the methods described above ensure that the printed circuit boards 207 remains securely fastened to the flexible surface 203 of the wearable electronic device 801.

The snap connectors could extend through to the outer surface of the wearable electronic device 801 as shown in FIG. 8B so that the apparatus 201 could be attached to a supplementary power source while the subject is wearing the wearable electronic device 801. This may make it easier for the subject to charge the apparatus 201 and may make the wearable electronic device 801 more convenient for the subject.

In the example of FIGS. 8A and 8B the components are provided adjacent to, or in direct contact with, the subject's skin. In other examples the apparatus 201 could be comprise two sections where a first section is provided on an inner surface of the sleeve and a second section is provided on an outer surface. In such examples electrical connections may be provided through the fabric of the sleeve so that there is a path for direct current between the first section and the second section. In other examples the components of the apparatus 201 could be provided on the same side of the flexible surface 203. The flexible surface 203 could then be folded so that some of the components face in a first direction and some of the components face in an opposing direction.

FIG. 9 shows an example apparatus 201 that may be fabricated using the methods described above. The apparatus 201 shown in FIG. 9 comprises two flexible printed circuit boards 207 and three conductive traces 205 extending between the two flexible printed circuit boards 207. The flexible printed circuit boards 207 are connected to the conductive traces 205 by electrical connections 211 which may be formed by the methods described above.

In the examples apparatus 201 in FIG. 9 the electrical connections 211 show a globule 901 of conductive material over the holes 213 in the flexible printed circuit boards 207. This globule is formed when the bead of conductive material is pushed through the hole 213. This could show that the methods described above have been used to form the apparatus 201.

In the example of FIG. 9 the holes 213 in the flexible printed circuit boards 207 are circular, or substantially circular. It is to be appreciated that other shaped holes 213 could be used in other examples of the disclosure.

In the examples described above the conductive traces 205 are provided on a single layer. In other examples the conductive traces 205 could be provided on different layers. FIGS. 10A to 10C show an example method which could be used to fabricate conductive traces 205 on a plurality of different layers.

In FIG. 10A a plurality of conductive traces 205 are deposited on a flexible surface 203. The conductive traces 205 can be deposited using screen printing or any other suitable process.

In FIG. 10B an interface layer is formed overlaying the conductive traces 205. The interface layer may be formed by spray coating any suitable non-conductive material. A mask 1001 may be provided over the ends of the conductive traces 205 so that the ends of the conductive traces 205 in the first layer remain exposed to enable them to be connected to the printed circuit boards 207.

In FIG. 10C a second plurality of conductive traces 205 are deposited over the interface layer. The second plurality of conductive traces 205 can be deposited using screen printing or any other suitable process. The second plurality of conductive traces 205 may have different shapes and/or widths compared to the first plurality of conductive traces 205.

Once the second plurality of conductive traces 205 have been formed both the first plurality of conductive traces 205 and the second plurality of conductive traces 205 can be connected to the printed circuit boards 207 using the methods as described above.

Depositing the conductive traces 205 in a plurality of different layers improves the usage of space within the apparatus 201 and may enable a smaller apparatus 201 to be formed.

Figure 11A:
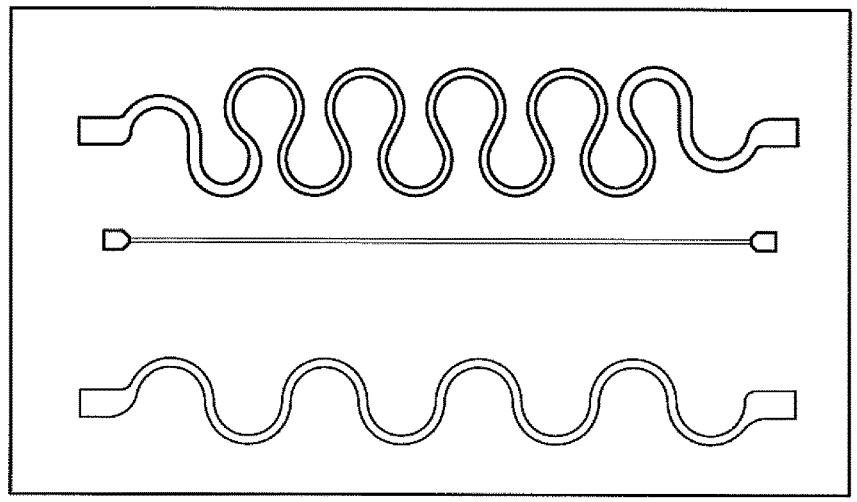
Figure 11B:
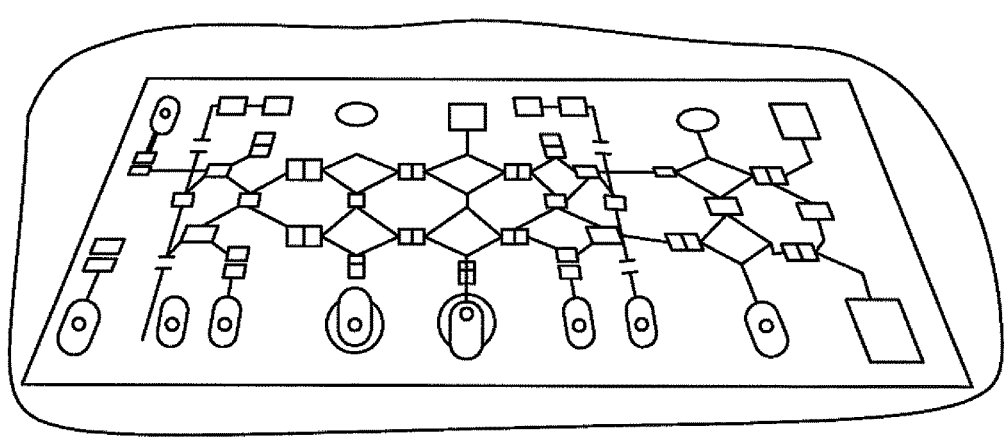
Figure 11C:
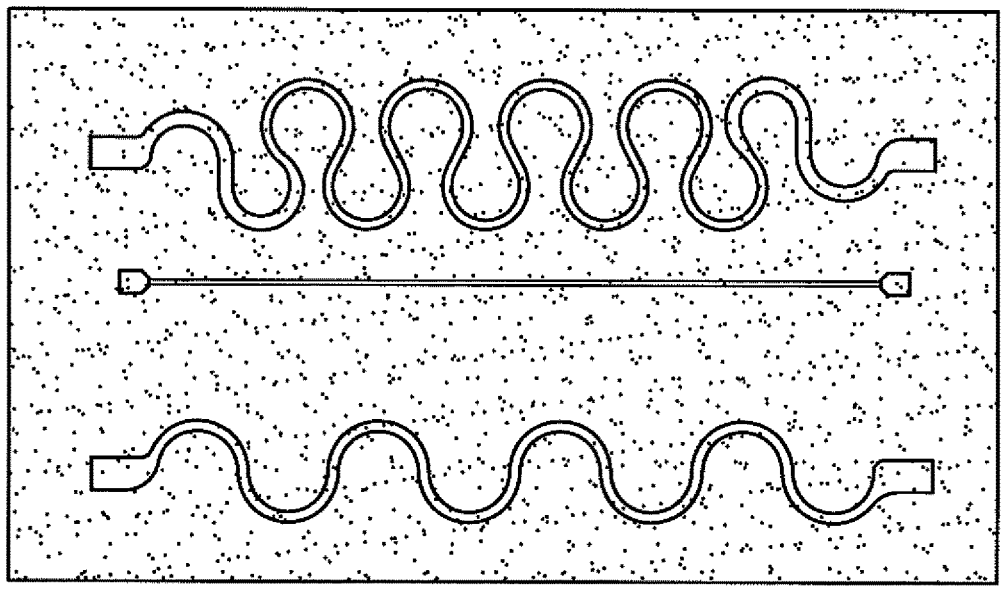
Figure 11D:
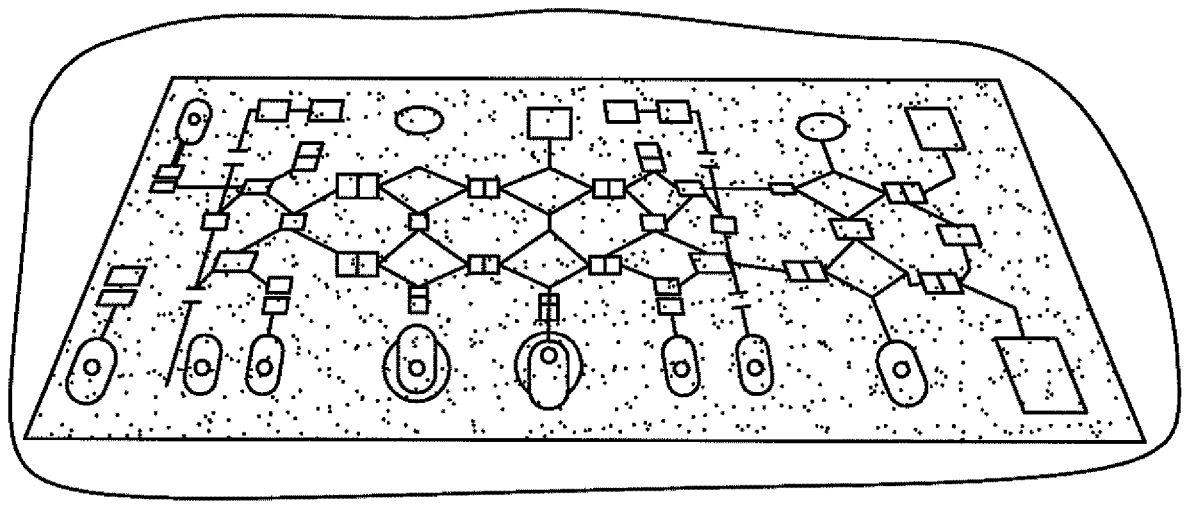
Figure 12:
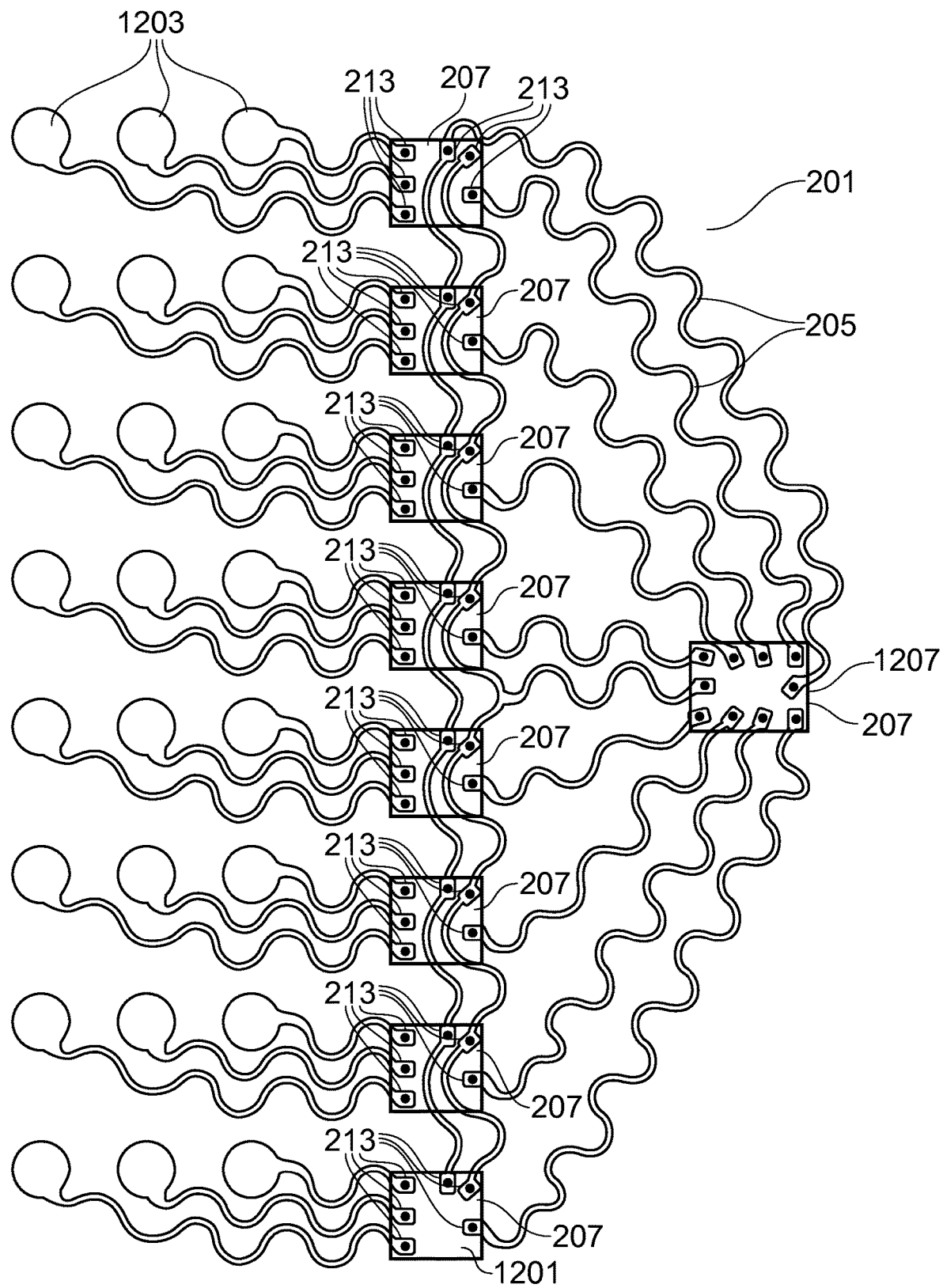

FIGS. 11A to 11D show components of an example apparatus 201 which has been formed using methods as described above. FIG. 11A shows a plurality of conductive traces 205 on a flexible surface 203 and FIG. 11B shows a flexible printed circuit board 207 on a flexible surface 203. FIG. 11C shows the plurality of conductive traces 205 on the flexible surface 203 after it has been washed and FIG. 11D shows the flexible printed circuit board 207 on the flexible surface 203 after it has been washed. An additional protective layer 407 is provided over the conductive traces 205 and the flexible printed circuit board 207.

The components were washed in warm water at 40° C. in a top load washing machine with a detergent. The Figures show that even exposure to heat, water, mechanical stress and chemicals during the washing procedure has not caused delamination of the flexible printed circuit board 207 and the additional protective layer 407 remains intact. Therefore this shows that examples of the disclosure could be used in wearable devices 801 that could be exposed to such conditions.

FIG. 12 shows another example apparatus 201 that could be formed using the described example methods. This example apparatus 201 comprises an array 1201 of flexible printed circuit boards 207. The array 1201 of flexible printed circuit boards 207 comprises eight flexible printed circuit boards 207. Other numbers of flexible printed circuit boards 207 could be used in other examples of the disclosure.

In the example of FIG. 12 the flexible printed circuit boards 207 are arranged in a linear array. Other arrangements for the array 1201 of flexible printed circuit boards 207 could be used in other examples of the disclosure. For instance a rectangular or circular array could be used instead.

In the example of FIG. 12 each of the flexible printed circuit boards 207 within the array comprises six holes 213. The six holes 213 enable the flexible printed circuit boards 207 to be coupled to six conductive traces 205 using the methods described above.

In the example of FIG. 12 each of the flexible printed circuit boards 207 within the array 1201 is coupled to six conductive traces 205. In the example of FIG. 12 three of the conductive traces 205 for each flexible printed circuit board 207 are coupled to a sensing pad 1203. This enables each of the flexible printed circuit boards 207 to be coupled to a plurality of sensing pads 1203. The sensing pads 1203 could comprise conductive foam 215 or any other suitable sensing material. The sensing pads 1203 could be configured to sense the same parameters in different locations or could be configured so that different sensing pads 1203 detect different parameters.

The sensing pads 1203 could be provided so that they are distributed across the flexible surface 203. This enables parameters to be detected in different areas. The relative positions of the sensing pads 1203 could be arranged so as to enable the parameters to be sensed over a large area. For example, if the sensing pads 1203 are distributed around a sleeve this could enable parameters to be sensed along the whole length of a user's arm or around the circumference of the user's arm.

Some of the conductive traces 205 are configured to couple the flexible printed circuit boards 207 to other flexible printed circuit boards 207 within the array 1201. This may enable the components on the flexible printed circuit boards 207 to be synchronized. In the example of FIG. 12 all of the flexible printed circuit boards 207 are also coupled to a main flexible printed circuit board 1207 via one or more conductive traces 205. The main flexible printed circuit board 1207 may be provided separate to the array 1201 of flexible printed circuit boards 207 and may enable control of the array 1201 flexible printed circuit boards 207. The main flexible printed circuit board 1207 may comprise components that are configured to collect and process signals from the flexible printed circuit boards 207 in the array 1207 and potentially to transmit these signals.

The example of FIG. 12 therefore shows how a plurality of sensing pads 1205 and flexible printed circuit boards 207 can be connected using examples of the disclosure.

In other examples of arrays some or all of the sensing pads 1203 could be provided with feedback devices 401.

In this description the term coupled means operationally coupled. Any number or combination of intervening elements can exist between coupled components including zero intervening components.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to 'comprising only one . . . ' or by using 'consisting'.

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although embodiments have been described in the preceding paragraphs with reference to various examples, it should be appreciated that modifications to the examples given can be made without departing from the scope of the claims.

Features described in the preceding description may be used in combinations other than the combinations explicitly described above.

Explicitly indicate that features from different embodiments (e.g. different methods with different flow charts) can be combined, to Although functions have been described with reference to certain features, those functions may be performable by other features whether described or not.

Although features have been described with reference to certain embodiments, those features may also be present in other embodiments whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer and exclusive meaning.

The presence of a feature (or combination of features) in a claim is a reference to that feature) or combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

I claim:

1. A method comprising:
   using a first process to form at least one conductive trace on a flexible surface;
   using a second process to form at least one bead of fluid conductive material at a first location;
   positioning at least one printed circuit board overlaying at least part of the at least one conductive trace such that the at least one bead of fluid conductive material is aligned with at least one hole in the printed circuit board; and
   pushing the printed circuit board towards the flexible surface so as to force the bead of fluid conductive material through the hole to form an electrical connection between the at least one conductive trace and an upper surface of the printed circuit board.

2. A method as claimed in claim 1 wherein the first process comprises a process which enables conductive material to be deposited across the flexible surface.

3. A method as claimed in claim 1 wherein the first process comprises at least one of screen printing, gravure, roll-to-roll, flexographic printing, 3D printing, spray coating, ink dispensing.

4. A method as claimed in claim 1 wherein the second process comprises a process which enables the bead of fluid conductive material to be deposited at a selected location.

5. A method as claimed in claim 1 wherein the bead of fluid conductive material comprises a same material as the at least one conductive trace.

6. A method as claimed in claim 1 wherein the bead of fluid conductive material and the at least one conductive trace are adhered to each other using a same material as the at least one conductive trace.

7. A method as claimed in claim 1 wherein the method comprises fastening the printed circuit board to the flexible surface with a same material as the at least one conductive trace.

8. A method as claimed in claim 1 comprising curing the fluid conductive material to provide a fastening between the at least one printed circuit board and the flexible material.

9. A method as claimed in claim 1 wherein the flexible surface forms part of an item of clothing.

10. An apparatus comprising:
    at least one conductive trace provided on a flexible surface;
    at least one printed circuit board positioned overlaying at least part of the at least one conductive trace;
    at least one connection between the at least one conductive trace and an upper surface of the at least one printed circuit board wherein the at least one connection extends through a hole in the at least one printed circuit board; and
    wherein the at least one connection was formed by pushing a bead of fluid conductive material from the conductive trace through the hole.

11. An apparatus as claimed in claim 10 wherein the at least one conductive trace and the at least one connection are formed from a same material.

12. An apparatus as claimed in claim 10 wherein the at least one conductive trace is formed using a first process and the at least one connection is formed using a second, different process.

13. An apparatus as claimed in claim 10 wherein the at least one conductive trace comprises a flexible conductive trace.

14. An apparatus as claimed in claim 10 comprising an adhesive on an underside of the at least one printed circuit board.

15. A method as claimed in claim 1 wherein the method comprises chemically bonding the at least one conductive trace to the electrical connection using a same material as the at least one conductive trace.

16. A method as claimed in claim 1 wherein the at least one conductive trace comprises a flexible conductive trace.

17. A method as claimed in claim 1 comprising providing adhesive on an underside of the at least one printed circuit board.

18. An apparatus as claimed in claim 10 wherein the bead of fluid conductive material and the at least one conductive trace are adhered to each other using a same material as the at least one conductive trace.

19. An apparatus as claimed in claim 10 wherein the apparatus comprises a fastening between the printed circuit board to the flexible surface, the fastening comprising a same material as the at least one conductive trace.

20. An apparatus as claimed in claim 10 wherein the apparatus comprises a chemical bond between the at least one conductive trace and the electrical connection, the chemical bond comprising a same material as the at least one conductive trace.

\* \* \* \* \*